(12) United States Patent
Klein et al.

(10) Patent No.: US 11,522,339 B2
(45) Date of Patent: Dec. 6, 2022

(54) METHOD FOR NARROWING THE LINEWIDTH OF A SINGLE MODE LASER BY INJECTING OPTICAL FEEDBACK INTO THE LASER CAVITY THROUGH BOTH LASER CAVITY MIRRORS

(71) Applicant: OE Solutions America, Inc., Ridgefield Park, NJ (US)

(72) Inventors: Holger N. Klein, Santa Barbara, CA (US); Nicolas Volet, Santa Barbara, CA (US)

(73) Assignee: OE Solutions America, Inc., Ridgefield Park, NJ (US)

( * ) Notice: Subject to any disclaimer, the term of this patent is extended or adjusted under 35 U.S.C. 154(b) by 222 days.

(21) Appl. No.: 16/994,633

(22) Filed: Aug. 16, 2020

(65) Prior Publication Data

US 2021/0050709 A1 Feb. 18, 2021

Related U.S. Application Data

(60) Provisional application No. 62/888,150, filed on Aug. 16, 2019.

(51) Int. Cl.
*H01S 5/065* (2006.01)
*H01S 5/12* (2021.01)
*H01S 5/068* (2006.01)
*H01S 5/125* (2006.01)

(52) U.S. Cl.
CPC ............ *H01S 5/0653* (2013.01); *H01S 5/068* (2013.01); *H01S 5/125* (2013.01); *H01S 5/1209* (2013.01)

(58) Field of Classification Search
CPC .... H01S 5/0653; H01S 5/0654; H01S 5/1209; H01S 3/08027; H01S 5/0656
USPC .......................................................... 372/20
See application file for complete search history.

(56) References Cited

U.S. PATENT DOCUMENTS

| | | | |
|---|---|---|---|
| 9,755,753 B2* | 9/2017 | Blumenthal | H01S 5/0085 |
| 2003/0123784 A1* | 7/2003 | Mukai | H01S 5/14 |
| | | | 356/477 |
| 2010/0303469 A1* | 12/2010 | Barton | H04B 10/6151 |
| | | | 29/428 |

OTHER PUBLICATIONS

Donati et al., "The Diagram of Feedback Regimes Revisited," Jul./Aug. 2013, vol. 19, No. 4, IEEE Journal of Selected Topics in Quantum Electronics, pp. 9.
Lang et al., "External Optical Feedback Effects on Semiconductor Injection Laser Properties," Mar. 1980, vol. QE-16, No. 3, IEEE Journal of Quantum Electronics, pp. 9.
Petermann, "External Optical Feedback Phenomena in Semiconductor Lasers," Jun. 1995, vol. 1, No. 2, IEEE Journal of Selected Topics in Quantum Electronics, pp. 10.
Tkach et al., "Regimes of Feedback Effects in 1.5-um Distributed Feedback Lasers," Nov. 1986, vol. LT-4, No. 11, Journal of Lightwave Technology, pp. 7.

* cited by examiner

*Primary Examiner* — Tuan N Nguyen
(74) *Attorney, Agent, or Firm* — Ichthus International Law PLLC

(57) ABSTRACT

A method or apparatus for narrowing the linewidth of a single mode laser is provided. The linewidth of a single mode laser is narrowed by injecting an optical feedback simultaneously into the first laser cavity mirror and the second laser cavity mirror of the single mode laser.

25 Claims, 19 Drawing Sheets

METHOD FOR NARROWING THE LINEWIDTH OF A SINGLE MODE LASER BY INJECTING OPTICAL FEEDBACK INTO THE LASER CAVITY THROUGH BOTH LASER CAVITY MIRRORS

CROSS-REFERENCES AND RELATED APPLICATIONS

This application claims priority to U.S. Provisional Application No. 62/888,150, filed Aug. 16, 2019, titled "METHOD FOR NARROWING THE LINEWIDTH OF A SINGLE MODE LASER BY INJECTING OPTICAL FEEDBACK INTO THE LASER CAVITY THROUGH BOTH LASER CAVITY MIRRORS," the content of which is incorporated herein by reference in its entirety.

TECHNICAL FIELD

The present disclosure relates to methods and systems for narrowing the linewidth of a laser, and in particular, for narrowing the linewidth of a single mode laser by injecting optical feedback into the laser cavity through more than one laser cavity mirror.

BACKGROUND

In today's optical communication networks, often a laser linewidth of around 100 kHz may be needed for higher order modulation format data transmission. Commonly, tunable lasers are used in such optical communication networks. The term "a tunable laser" used herein means a laser whose wavelength of operation can be changed in a controlled manner.

To obtain a narrower linewidth, thermally tuned lasers have been developed and used, in which the laser wavelength tuning is achieved by heating an optical waveguide and thus changing the refractive index. But the thermally tuned lasers are often cost prohibitive. The thermal tuning prevents electrical noise from external power supplies to directly interact with an optical mode inside the laser cavity, but, as mentioned above, the development of thermal tuning lasers is cost prohibitive.

Further, optical feedback effects have been studied and documented in many literature articles including an book titled "Unlocking Dynamical Diversity: Optical Feedback Effects on Semiconductor lasers" by editor(s): Deborah M. Kane and K. Alan Shore, Print ISBN: 9780470856192, Online ISBN: 9780470856215, doi: 10.1002/0470856211, Wiley (2005); R. R. Lang and K. Kobayashi, "External optical feedback effects on semiconductor injection laser properties," IEEE Journal of Quantum Electronics, Vol. 16, No. 3, pp. 347-355, March 1980. doi: 10.1109/JQE.1980.1070479; K. Petermann, "External optical feedback phenomena in semiconductor lasers," IEEE Journal of Selected Topics in Quantum Electronics, Vol. 1, No. 2, pp. 480-489, June 1995. doi: 10.1109/2944.401232; R. Tkach and A. Chraplyvy, "Regimes of feedback effects in 1.5-um distributed feedback lasers," Journal of Lightwave Technology, Vol. 4, No. 11, pp. 1655-1661, November 1986. doi: 10.1109/JLT.1986.1074666; S. Donati and R. Horng, "The diagram of feedback regimes revisited," IEEE Journal of Selected Topics in Quantum Electronics, Vol. 19, No. 4, pp. 1500309-1500309, July-August 2013, Art no. 1500309, doi: 10.1109/JSTQE.2012.2234445, the contents of which are incorporated herein by reference in their entirety. However, these approaches are often complicated and costly approaches for implementation of design.

As such, there is a further need for a novel, enhanced, cost-effective method of obtaining a narrower linewidth of a tunable laser, e.g., compared to conventional technologies such as thermal heaters for cavity tuning.

SUMMARY

In an aspect of the present technology, a tunable laser with a laser linewidth is provided. By way of example, the tunable laser may be a single mode laser with a certain linewidth whose laser cavity includes a laser gain medium, a first cavity mirror, a second cavity mirror and the linewidth of the single mode laser is narrowed by injecting an optical feedback into the first and second cavity mirrors simultaneously. The term "a single mode laser" used herein shall mean that the light is emitted in one longitudinal cavity mode at a single frequency and all other modes are sufficiently suppressed.

In an aspect of the present disclosure, the single mode laser may be of different types, such as a semiconductor, a solid-state laser, a gas laser, or a chemical laser.

In another aspect of the present disclosure, the single mode laser may have a side mode suppression ratio (SMSR) of at least 15 dB.

In another aspect of the present disclosure, the narrowing of the laser linewidth may be obtained by removing an optical isolator from an assembly of the laser and injecting the optical feedback via reflection elements simultaneously into the first and second cavity mirrors.

In an aspect of the present disclosure, the laser linewidth may be below 10 kHz, preferably about 5 kHz.

In another aspect of the present disclosure, the laser may include a beam splitter/combiner with a variable split/combining ratio and a reflection element coupled to the beam splitter/combiner with a variable split/combining ratio.

In another aspect of the present disclosure, the laser cavity may be configured to include one or more additional cavity emission ports or power taps inside the laser cavity.

In another aspect of the present disclosure, the optical feedback of the laser may be injected into the first and the second cavity mirrors via the one or more additional cavity emission ports.

In another aspect of the present disclosure, the laser cavity may include a circulating cavity with two or more cavity emission ports.

In another aspect of the present disclosure, the single mode laser may be configured to operate with a SMSR up to about 60 dB.

In another aspect of the present disclosure, the single mode laser may be a distributed feedback (DFB) laser.

In another aspect of the present disclosure, the single mode laser may be a semiconductor laser, a solid-state laser, a gas laser, or a chemical laser.

In another aspect of the present disclosure, the laser cavity mirror reflectivity of the first cavity mirror may be substantially the same as that of the second cavity mirror.

In another aspect of the present disclosure, the narrowing of the laser linewidth may be obtained by injecting simultaneously the optical feedback into the first cavity mirror and the second cavity mirror by a predetermined amount. This predetermined amount is a fraction of a total output power of the single mode laser.

In another aspect of the present disclosure, the laser may include at least one reflection element disposed at a predetermined distance, and the at least one reflection element may be configured to generate the optical feedback.

In another aspect of the present disclosure, the optical feedback may be injected into the laser cavity mirror by two reflection elements with variable power reflection ratios.

In another aspect of the present disclosure, the at least one reflection element may include a reflective surface, a feedback loop, or a waveguide grating.

In another aspect of the present disclosure, the single mode laser may include one or more wavelength filter elements included in the laser cavity.

In another aspect of the present disclosure, the single mode laser may be an external cavity laser, a monolithically integrated laser, a hybrid integrated laser, or a heterogeneously integrated laser.

In another aspect of the present disclosure, the single mode laser may be followed by at least one optical amplifier configured to amplify laser emission light and reflected feedback light at a location between the laser cavity mirrors and the at least one reflection element.

In an aspect of the present disclosure, a method for reducing a laser linewidth of a single mode laser is provided. In the method, the single mode laser includes a laser gain medium, a first cavity mirror, and a second cavity mirror. The method includes a step of injecting an optical feedback simultaneously into the first cavity mirror and the second cavity mirror.

In an aspect of the present disclosure, the method may provide that the single mode laser has a side mode suppression ratio (SMSR) of at least 15 dB.

In another aspect of the present disclosure, the method may further provide that the laser linewidth of the single mode laser is below 10 kHz, preferably about 5 kHz.

In an aspect of the present disclosure, the method may provide that the laser cavity of the single mode laser is configured to include one or more additional cavity emission ports or power taps inside the laser cavity.

In an aspect of the present disclosure, the method may also provide that the optical feedback is injected into both of the cavity mirrors via at least one of the cavity emission ports.

In another aspect of the present disclosure, the method may provide that the single mode laser includes a circular cavity with two or more cavity emission ports.

In another aspect of the present disclosure, the method may provide that the laser cavity mirror reflectivity of the first cavity mirror is substantially the same as that of the second cavity mirror.

In another aspect of the present disclosure, the method may further include a step of simultaneously injecting the optical feedback into the first cavity mirror and the second cavity mirror by a predetermined amount that is a fraction of a total output power of the single mode laser.

In another aspect of the present disclosure, the method may further provide that the optical feedback is generated by a reflection element disposed at a predetermined distance.

In another aspect of the present disclosure, the method may further provide that the optical feedback is generated at least by a reflective surface, a feedback loop, a fiber grating, or a waveguide grating.

In another aspect of the present disclosure, the method may further provide that the single mode laser may include one or more wavelength filter elements included in the laser cavity.

In another aspect of the present disclosure, the method may further provide that the single mode laser includes a laser based on InP, GaN, GaAs, Si or other semiconductor materials. Further, in the method, the single mode laser may be a distributed feedback (DFB) laser.

In another aspect of the present disclosure, the method may provide that the single mode laser may be an external cavity laser, a monolithically integrated laser, a hybrid integrated laser, or a heterogeneously integrated laser.

In another aspect of the present disclosure, the method may further provide that the single mode laser is a fixed wavelength laser or a wavelength tunable laser configured to emit light at a single emission wavelength.

In another aspect of the present disclosure, the method may further provide that the optical feedback is generated by a reflection element such that optical output paths are combined into a single optical path.

In another aspect of the present disclosure, the method may further provide that the single mode laser may include a beam combiner/splitter with a variable ratio.

In another aspect of the present disclosure, the method may further provide that the optical feedback may be injected into each laser cavity by two independent reflection elements with variable power reflection ratios.

In another aspect of the present disclosure, the method may further provide that the single mode laser may be followed by at least one amplifier to amplify laser emission light and the reflected feedback light at a point between the laser cavity mirrors and reflection elements.

In an aspect of the present technology, it is noted that the single mode laser may be a tunable laser of a U-shape Sampled Grating Distributed Bragg Reflector (SG-DBR) laser with two cavity mirrors, the linewidth of the single mode laser may be reduced by as much as a factor of 200 by injecting an optical feedback back into the laser cavity through both cavity mirrors of the tunable laser. By way of example, a narrow linewidth of e.g., 60 kHz or below may be obtained, which is needed for 400 Gbit/s and beyond high-speed coherent communications.

In an aspect of the present disclosure, by employing various inventive aspects of the present disclosure, the linewidth of a tunable laser may be reduced from about 2 MHz (without optical feedback) to around about 5 kHz (with optical feedback). Further, under various operating conditions of the tunable laser, such as, e.g., drive currents, temperatures, wavelengths, etc., injection of optical feedback into the laser cavity may lead to a significant reduction in the linewidth of the tunable laser.

Furthermore, in accordance with an aspect of the present technology, by simultaneously injecting the optical feedback into both laser cavity mirrors of a tunable laser, instead of having the optical feedback injected only into one cavity mirror, the laser linewidth or linewidth of the tunable laser may be significantly reduced, thereby providing and enabling next generation devices for supporting various higher order modulation formats.

BRIEF DESCRIPTION OF THE DRAWINGS

These and other features, aspects and advantages of the present disclosure will become better understood from the following description, appended claims, and accompanying figures where:

DESCRIPTION OF EMBODIMENT(S)

Figure 1A:
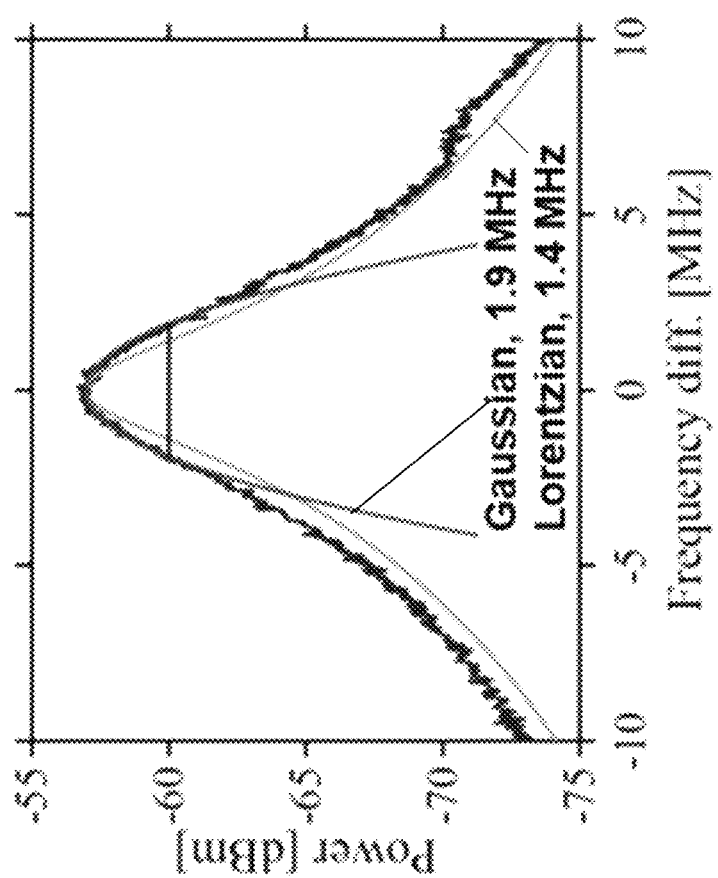
FIG. 1A is a power over frequency difference diagram conceptually illustrating the linewidth of a U-shape SG-DBR tunable laser with an optical isolator and without optical feedback.

The detailed description of illustrative examples will now be set forth below in connection with various drawings. The description below is intended to be exemplary and in no way limit the scope of the present technology. It provides a detailed example of possible implementation and is not intended to represent the only configuration in which the concepts described herein may be practiced. As such, the detailed description includes specific details for the purpose of providing a thorough understanding of various concepts, and it is noted that these concepts may be practiced without these specific details. In some instances, well known structures and components are shown in block diagram form in order to avoid obscuring such concepts. It is noted that like reference numerals are used in the drawings to denote like elements and features.

Methods and devices that implement example embodiments of various features of the present technology are described herein with reference to the drawings. Reference in the description herein to "one embodiment" or "an embodiment" is intended to indicate that a particular feature, structure, or characteristic described in connection with the example embodiments is included in at least an embodiment of the present technology or disclosure. The phrases "in one embodiment" or "an embodiment" in various places in the description herein are not necessarily all referring to the same embodiment.

Systems and methods that enable a tunable optical transmitter capable of generating optical signals with simple intensity modulation or advanced modulation formats will be beneficial in optical transmission systems and networks. Example embodiments described herein have several features, no single one of which is indispensable or solely responsible for their desired attributes. In the following description, specific details are given to provide a thorough understanding of the example embodiments. However, it will be understood by one of ordinary skill in the art that the example embodiments may be practiced without these specific details. Well-known circuits, structures and techniques may not be shown in detail in order not to obscure the example embodiments (e.g., circuits in block diagrams, etc.).

As used in the present disclosure, except where the context requires otherwise, the term "comprise" and variations of the term, such as "comprising," "comprises" and "comprised" are not intended to exclude other additives, components, integers or steps.

Further, as used in the present disclosure, the word "simultaneously" shall mean that feedback is added to both facets of a laser at once and not one or the other at different times by switching them on and off in the context, in addition to the ordinary meaning of the word. Also, in an aspect of the present disclosure, the distance between cavity mirrors and the splitter/combiner may not matter at all as for the embodiments where the feedback is generated by different reflection elements. Also, as used in the present disclosure, the word "linewidth" may also include an effect on the frequency noise spectrum. That is, in an aspect of the present disclosure, when the linewidth is reduced the frequency noise is also reduced at different ranges of Fourier frequencies. Also, the terms such as "laser linewidth," "linewidth," "optical linewidth" and "effective spectral width" may be interchangeably used herein.

Each embodiment may be used with the other, and other modulators and/or laser may be used as well with the corresponding embodiments. Various embodiments described herein include a compact optical transmitter having a reduced die size and aspect ratio over prior art, improved laser performance, improved methods to measure, characterize and monitor attributes of the laser, improved methods to qualify the parameters of fabricated lasers, improved methods to calibrate tunable lasers and modulators and transmitters, and improved method to reduce cost and increase yield in a manufacturable environment over that possible with the existing technology.

In the following, although specific details are given regarding the present technology, using an example of a tunable laser embodying a U-shape SG-DBR laser, the embodiments of the present technology are not limited thereto and thus may include other types of a laser which is a device that emits light through a process of optical amplification based on stimulated emission of electromagnetic radiation. Further, a laser typically consists of a gain medium, a mechanism to energize the gain medium and a section to provide optical feedback. The gain medium of the laser may include a material with properties that allow it to amplify light by way of stimulated emission. Further, a common type of laser may use feedback from an optical cavity, i.e., a pair of mirrors on either end of the gain medium, in which light bounces back and forth between the pair of mirrors, passing through the gain medium and being amplified each time. In one implementation, one of the two mirrors may serve as an output coupler which is partially transparent, letting the light escape through the mirror. In most lasers, however, lasing begins with spontaneous emission into the lasing mode, in which the initial light is amplified by stimulated emission in the gain medium and thus the stimulated emission produces light that matches an input signal in direction, wavelength and polarization.

In one embodiment, a tunable laser may include a first optical emission and a second optical emission. Both the first and second optical emissions of the dual emission laser are often used in optical communication with a modulator or other optical devices. The dual emission laser may be formed with a light bending section such as a waveguide in the form of a U-shape, a set of total internal reflection (TIR) mirrors. Further, the dual emission laser may include two or more laser gain mediums. For the example design and implementation of a tunable laser, one approach may be employed as disclosed in U.S. Pat. No. 9,755,753 to D. Blumenthal and titled "Tunable U-laser transmitter with integrated Mach-Zehnder Modulator," the content of which is incorporated herein by reference in its entirety.

A tunable laser is a laser that produces an output wavelength that can be tuned or adjusted. In one implementation, tunable lasers often require a linewidth of 100 kHz to 300 kHz. A higher order modulation format, such as the quadrature amplitude modulation (QAM) may also require a narrower linewidth for the higher order of the modulation format. By way of example, a narrow linewidth, such as 60 kHz or below may be needed for 400 Gbit/s and beyond high-speed coherent communications.

In an aspect of the present disclosure, in one implementation, by employing various inventive aspects of the present disclosure, the linewidth of a tunable laser may be reduced from about 2 MHz (without any optical feedback) to around about 5 kHz (with an optical feedback). Further, to provide error free transmission performance for next generation transmission systems, a linewidth of a tunable laser around 80 kHz may be needed. As such, the present technology disclosed herein for narrowing the linewidth of a laser provides distinctive advantages over the existing technologies.

Generally, the optical feedback may be introduced when some portion of an optical output is fed back into the laser ("optical feedback"). Although the optical feedback is often associated with an undesirable optical effect in the optical path because the optical feedback may destabilize the laser and produce different kinds of undesirable effects, however, in various aspects of the present disclosure, the optical feedback may be used to provide advantageous benefits over the existing technology.

It is noted that different figures are used to illustrate various embodiments of the present technology and that various approaches or methodologies may be used to inject optical feedback into a laser cavity to narrow the linewidth of a laser to narrow the linewidth to meet certain application requirements.

The present disclosure provides or illustrates, but is not limited thereto, two separate methods of generating and feeding back of an optical feedback that may be used to narrow the linewidth of a tunable laser. The first method is to slightly loosen a FC/PC flat fiber connector to generate a small optical feedback inside the FC/PC fiber connector. The second method is to use one or more reflection elements or devices so that the optical feedback may be made into the laser cavity of the laser. Further, in the second case, an optical isolator may be removed from a package of the laser such that the optical feedback into the laser cavity is strengthened. That is, the removal of the optical isolator is not needed for generating and forcing the optical feedback into the laser cavity, but rather the removal of the optical isolator is needed for facilitating a stronger optical feedback.

By way of example, it is possible to generate a small optical feedback and narrow the laser linewidth by loosening a FC/PC flat fiber connector. That is, generally, an optical isolator is used to avoid the back reflection into the laser cavity, but by using various aspects of the present technology, it is also possible to reduce the laser linewidth of the tunable laser by forcing the optical feedback into the laser cavity.

For clarity and to provide a better understanding of the present technology, FIGS. 1A-1D are provided herein for illustration purpose. FIG. 1A shows a typical laser linewidth of a tunable U-laser without any optical feedback. In the example, a laser linewidth of 1.9 MHz (for Gaussian fit) of the tunable U-laser is observed in which an optical isolator is used in an output path to avoid optical feedback. The laser linewidth shown in FIG. 1A was obtained measuring a U-shape SG-DBR tunable laser assembly using a delayed self-heterodyne (DSH) measurement technique using a fiber delay of 5 km and at temperature of 40 degrees in Celsius. As shown in FIG. 1A, it is noted that a Gaussian fit shows about 1.9 MHz and a Lorentzian fit shows about 1.4 MHz as the laser linewidth.

Figure 1B:
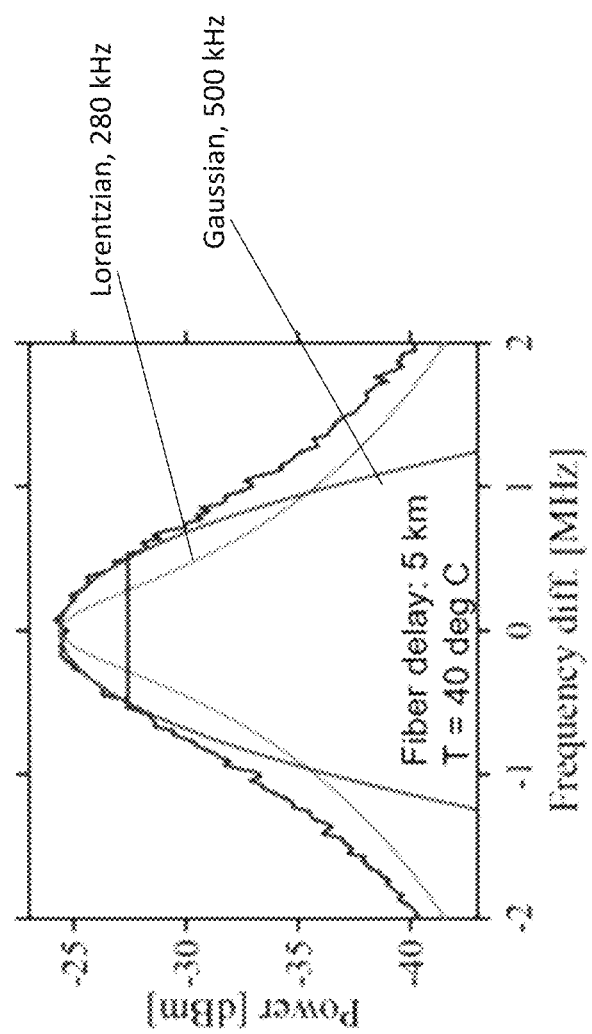
FIG. 1B is a power over frequency difference diagram conceptually illustrating the linewidth of a U-shape SG-DBR tunable laser when optical feedback is introduced.

Now, in the example of FIG. 1A, with an optical isolator in use, by loosening the FC/PC fiber connector, an optical feedback is forced into the laser cavity, for example, and the result is shown in FIG. 1B. FIG. 1B shows a narrower laser linewidth of the tunable U-laser when the optical feedback is forced. In the example, the laser linewidth of the tunable U-laser is narrowed to about 500 kHz by generating optical feedback. Further, the Gaussian fit shows about 500 kHz and the Lorentzian fit shows about 280 kHz as the laser linewidth. As mentioned above, although the feedback is generated by loosening the FC/PC fiber connector, the packaged assembly of the tunable U-laser still includes an optical isolator that has an optical isolation of about 30 dB.

Figure 1C:
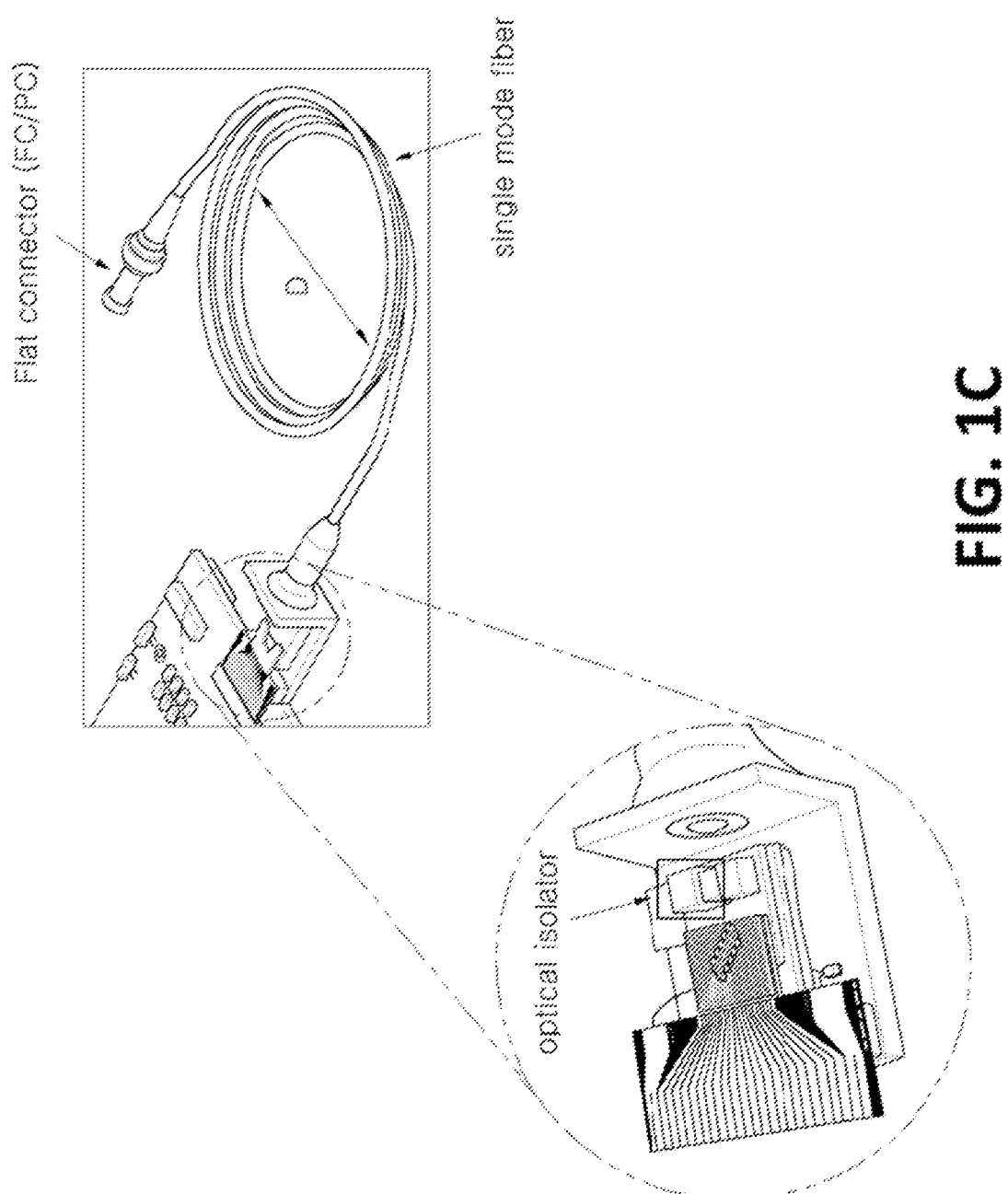
FIG. 1C shows images showing a set-up for narrowing the linewidth of a tunable laser in an aspect of the disclosure.

FIG. 1C illustrates an example set-up of the tunable U-laser of FIG. 1B, in which an optical isolator is used in the tunable U-laser and a single mode fiber having a length of about 2 m is used with the FC/PC flat connector. It is also noted that although the fiber length to the FC/PC connector is about 2 m, the present disclosure is not limited thereto and that the fiber can be a standard single mode fiber (SMF) or polarization maintaining fiber (PMF) and the optical reflection does not have to originate at an optical fiber interface.

Figure 1D:
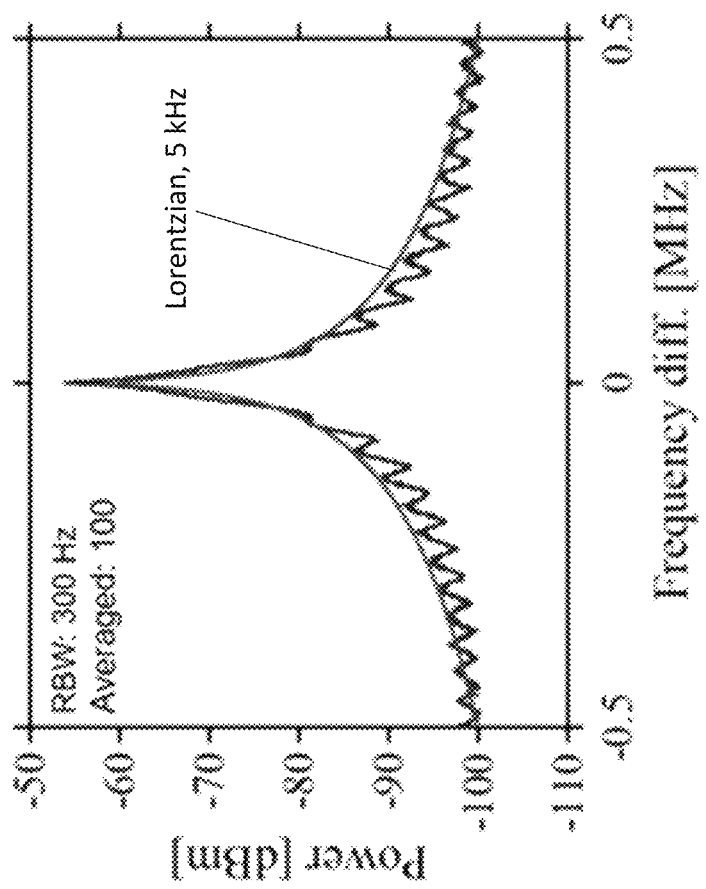
FIG. 1D is a power over frequency difference diagram conceptually illustrating the linewidth of a U-shape SG-DBR tunable laser when an optical isolator is removed from the package and optical feedback is introduced into the laser.

In an aspect of the present disclosure, now the optical isolator in the laser package is removed from the laser package of FIG. 1C and optical feedback is forced into the laser cavity simultaneously. FIG. 1D illustrates the result when the optical isolator is removed and the optical feedback is forced into the laser cavity of the tunable U-laser. In the example, it is noted that the optical feedback strength into the tunable U-laser has been significantly increased, thereby leading to a much narrower linewidth, e.g., showing a Lorentzian fit of about 5 kHz. Typically, the FC/PC fiber connector offers an optical return loss of about 50 dB, however, when the fiber connection is opened or loosened up, the flat surface becomes reflective, creating optical feedback. In one example, since a standard single mode fiber with n=1.467 reflects about 3.6% at the interface to air, when the FC/PC fiber connector is loosened, about 3.6% of the laser output power will be reflected back towards the laser cavity. It is also noted that an amount of reflection of 3.6% is just exemplary for illustrative purposes and the present disclosure is not limited thereto.

Referring back to FIG. 1D, it is noted that the linewidth has been narrowed to 5 kHz after injecting optical feedback into the tunable U-laser with the optical isolator being removed from the package, and a much stronger optical feedback into the laser cavity is generated. Also, in the example, the narrowing of the linewidth has been observed over an entire wavelength tuning range, e.g., C-band. Further, in coherent light applications, some oscillations may be observed in the spectrum and in the example, the fiber of 5 km in spool length used in the delayed self-heterodyne measurement system is shorter than the laser coherence length. It is noted also that without the optical feedback into the tunable U-laser no oscillations may be observed, which also demonstrates the linewidth narrowing effect.

As mentioned above, in an aspect of the present disclosure, to facilitate narrowing of the laser linewidth, an optical isolator is removed from a tunable laser package and optical feedback is made and forced back into the laser cavity. As a result, a cost reduction in the manufacturing of the tunable laser package may be obtained since the price of an optical isolator may be deducted from the total cost of assembly of the tunable laser package, and the assembly process thereof for achieving a narrower linewidth of the tunable laser package may be made simpler.

Further, based on the present technologies as described herein, without a large amount of investment and huge development efforts, the linewidth of a tunable laser or a tunable laser photonic integrated circuit (PIC) may be reduced to as low as 5 kHz which may result in a factor of 16 lower than what the existing devices should be able to deliver at present time.

Figure 1E:
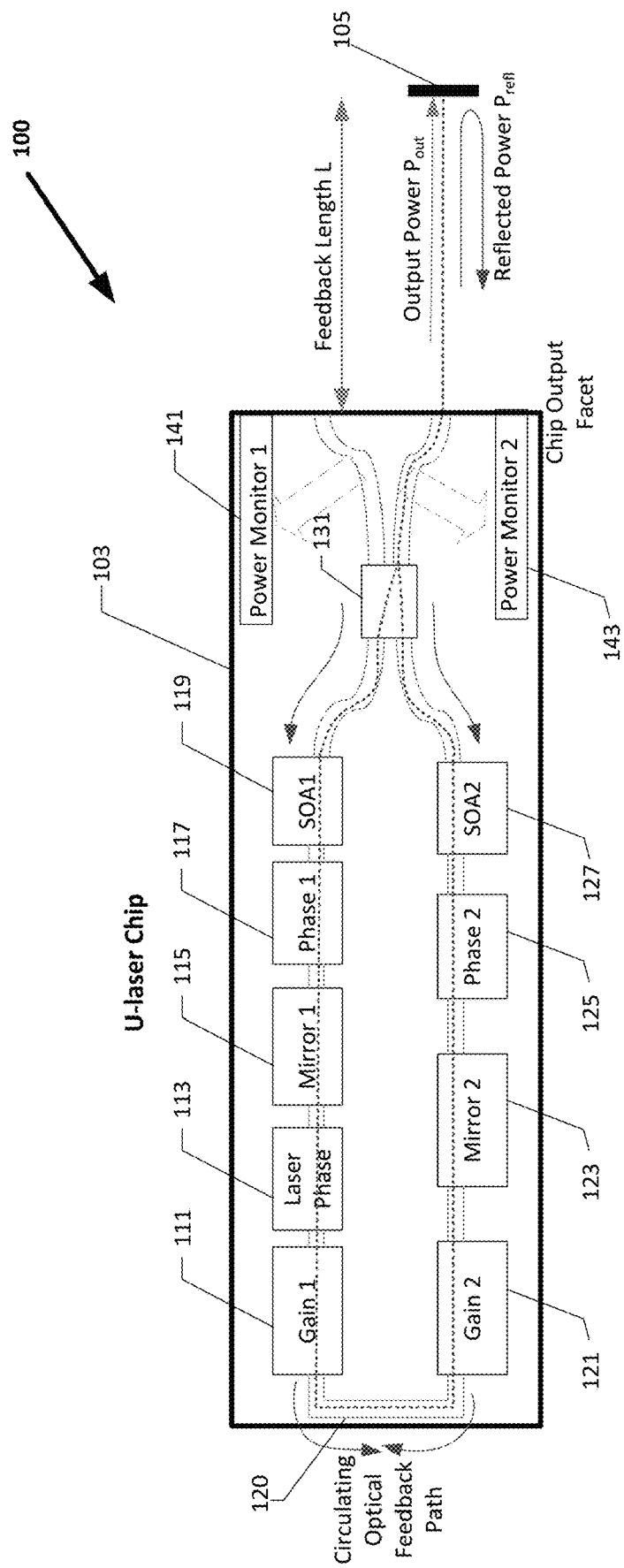
FIG. 1E is a block diagram conceptually illustrating an embodiment of a tunable laser in accordance with an aspect of the present disclosure.

FIG. 1E illustrates another embodiment of a tunable U-laser which exhibits a very pronounced linewidth narrowing when an optical feedback is injected back into a laser chip. By way of example, the tunable U-laser 100 is configured to include at least a laser chip, e.g., a U-laser chip 103, and a reflection element 105 disposed at a predetermined distance L from the U-laser chip 103. The U-laser chip 103 is configured to include at least a first gain medium 111, e.g., Gain 1, a laser phase 113, a first mirror 115, e.g., Mirror 1, a first phase 117, e.g., Phase 1, a first semiconductor optical amplifier 119, e.g., SOA1, a waveguide 120, i.e., a U-shaped waveguide, a second gain medium 121, e.g., Gain 2, a second mirror 123, e.g., Mirror 2, a second phase 125, e.g., Phase 2, a second semiconductor optical amplifier 127, e.g., SOA2, a combiner 131, a first power monitor 141, e.g., Power Monitor 1, and a second power monitor 143, e.g., Power Monitor 2.

In the example, the first gain medium 111, e.g., Gain 1, and the second gain medium 121, e.g., Gain 2, are gain media or sections which amplify the light or a light beam, by adding energy via an electrical pumping or optical pumping. The waveguide 120 is configured to guide the light beam and include a light bending portion such as a U-shape or other shape. In the present disclosure, a U-type laser or U-laser refers to a laser including the light bending portion in the form of a U-shape. Further, a phase section, such as Phase 1 or Phase 2 is configured to create an adjustable phase shift between the gain medium and the mirrors. Further, the first mirror, e.g., Mirror 1, and the second mirror, e.g., Mirror 2, are connected via the waveguide 120 and are configured to provide optical emissions. The first mirror and the second mirror are configured to form an optical resonator (or optical cavity) and include mirrors of a specific reflectivity. In the tunable laser, tuning of a wavelength may be accomplished by injecting current into the phase and mirror sections which change their refractive index. Light from the gain medium produced by spontaneous emission is reflected by the mirrors back into the gain medium where it may be further amplified by stimulated emission. The light then may reflect from the mirrors and thus pass through the gain medium before exiting the cavity.

In the present disclosure, the reflectivity of a mirror is defined to be a percentage of the optical power which is reflected. The first semiconductor optical amplifier 119 and the second optical semiconductor amplifier 127 are configured to boost the level of power of the laser output power. The combiner 131 is configured to combine the laser outputs to provide a common laser output signal, for example, Output Power $P_{out}$. Also, in one implementation, the combiner 131 may be a coupler with a splitting/combing ratio, e.g., a 50/50 ratio. Further, the example embodiment 100 includes a reflection element 105, which is placed at a predetermined distance, e.g., a feedback length L, and may be configured to reflect an output power, $P_{out}$, emitted at the output facet of the tunable U-laser chip 103, as Reflected Power $P_{refl}$. By way of example, the predetermined distance or the feedback length L may be 50 cm.

In the example, a fraction of the output power $P_{out}$ is reflected back into the output facet of the tunable U-laser chip 103. Here, it is noted that although the present technology is described with respect to a U-laser, the disclosed technology may also apply to other types of a laser including a tunable ring-resonator based laser, Y-laser, and amplitude and phase locked tunable lasers, and many other variations.

As mentioned above, there exist various techniques and methods for narrowing the linewidth or the effective spectral width of a laser. That is, as shown in various embodiments disclosed herein, a linewidth of a laser such as a tunable U-laser 100 may be narrowed by removing optical isolators in a design package and making and injecting optical feedback simultaneously into the laser cavity.

That is, in an aspect of the present disclosure, optical feedback for narrowing the laser linewidth may be achieved by simply removing an optical isolator from an assembly of a laser and using one or more reflection elements placed at a predetermined distance for reflecting a fraction of the laser output power as optical feedback back into the laser. Although an optical isolator is typically used to avoid optical feedback, e.g., back reflection, into the laser cavity, by using various aspects of the present technology, it has been possible to reduce the laser linewidth by removing the optical isolator and forcing the optical feedback. As a result, it is also possible to reduce the cost of manufacturing the laser because the use of optical isolators is eliminated in the design of a package of the laser.

In one implementation, narrowing of a linewidth (e.g., the narrowing effect) by a factor of 400 or higher may be achieved, e.g., from 2 MHz to 5 kHz. In an aspect of the present disclosure, over a range of optical feedback percentages, the narrowing effect has been observed. Further, the narrowing effect of the linewidth was observed for all wavelength settings of a tunable laser and for various SOA pumping currents which are independent of optical amplification.

In another aspect of the present disclosure, the optical feedback may be split by a two-by-two (2×2) multimode interference coupler (MMI) and fed back into both laser cavity mirrors (e.g., Mirror 1 and Mirror 2) after optical amplification by both the first optical amplifier and the second optical amplifier (e.g., SOA1 and SOA2). In the example, the first cavity mirror, e.g., Mirror 1 and the second cavity mirror, e.g., Mirror 2 do provide a stable mode selection for the original cavity. In an aspect of the present disclosure, the optical feedback cavity may also be a circulating loop forming a circulating optical feedback path.

Referring back to FIG. 1E, a laser cavity may be formed by gain mediums 111 and 113 (e.g., Gain 1 and Gain 2) and two cavity mirrors 153 and 123 (e.g., Mirror 1 and Mirror 2). Further, in the example, laser light may exit both facets and combined in a beam splitter/combiner 131 with a variable split/combine ratio and output as Output Power $P_{out}$. A fraction of the laser light may then be reflected back (e.g., Reflected Power $P_{refl}$) by the reflection element 105 towards the laser cavity mirrors, Mirror 1 and Mirror 2. The reflected light may then be split by the beam splitter/combiner 131 and enters back into the laser cavity through both cavity mirrors, Mirror 1 and Mirror 2. Further, in the example and others disclosed herein, a laser cavity mirror reflectivity of the first cavity mirror may be substantially the same as that of the second cavity mirror.

In another aspect of the present disclosure, the reflection element 105 or other reflection elements included in various embodiments disclosed herein may include a reflective surface including a mirror plane or the like. In another aspect of the present disclosure, a wavelength filter for single mode lasing may also be included in mirrors such as Cavity Mirror 1 and/or Cavity Mirror 2.

Further, as mentioned above, the linewidth may be narrowed by injection of the optical feedback into the first cavity mirror and the second cavity mirror simultaneously by a predetermined amount, which may be a fraction of a total output power of the single mode laser.

In the present disclosure, the term "a single mode laser" as used herein shall mean including a laser operating with a side mode suppression ratio (SMSR) of at least 15 dB. The SMSR describes an amplitude difference between the main mode and the largest side mode in decibels. A typical value of SMSR may be greater than 30 dB, indicating that most of the power exists in the main mode.

Also, the embodiments disclosed herein relate to the form of a single mode laser. The single mode laser may include a laser of different types, such as a semiconductor laser, a solid-state laser, a gas laser, or a chemical laser. In another aspect of the present disclosure, the single mode laser may be a distributed feedback laser (DFB). Also, the single mode laser may include one or more wavelength filter elements included in the laser cavity. It is noted that in the drawings disclosed herein, output light is indicated by an arrow in blue and reflected or feedback light is indicated by an arrow in red.

Figure 2:
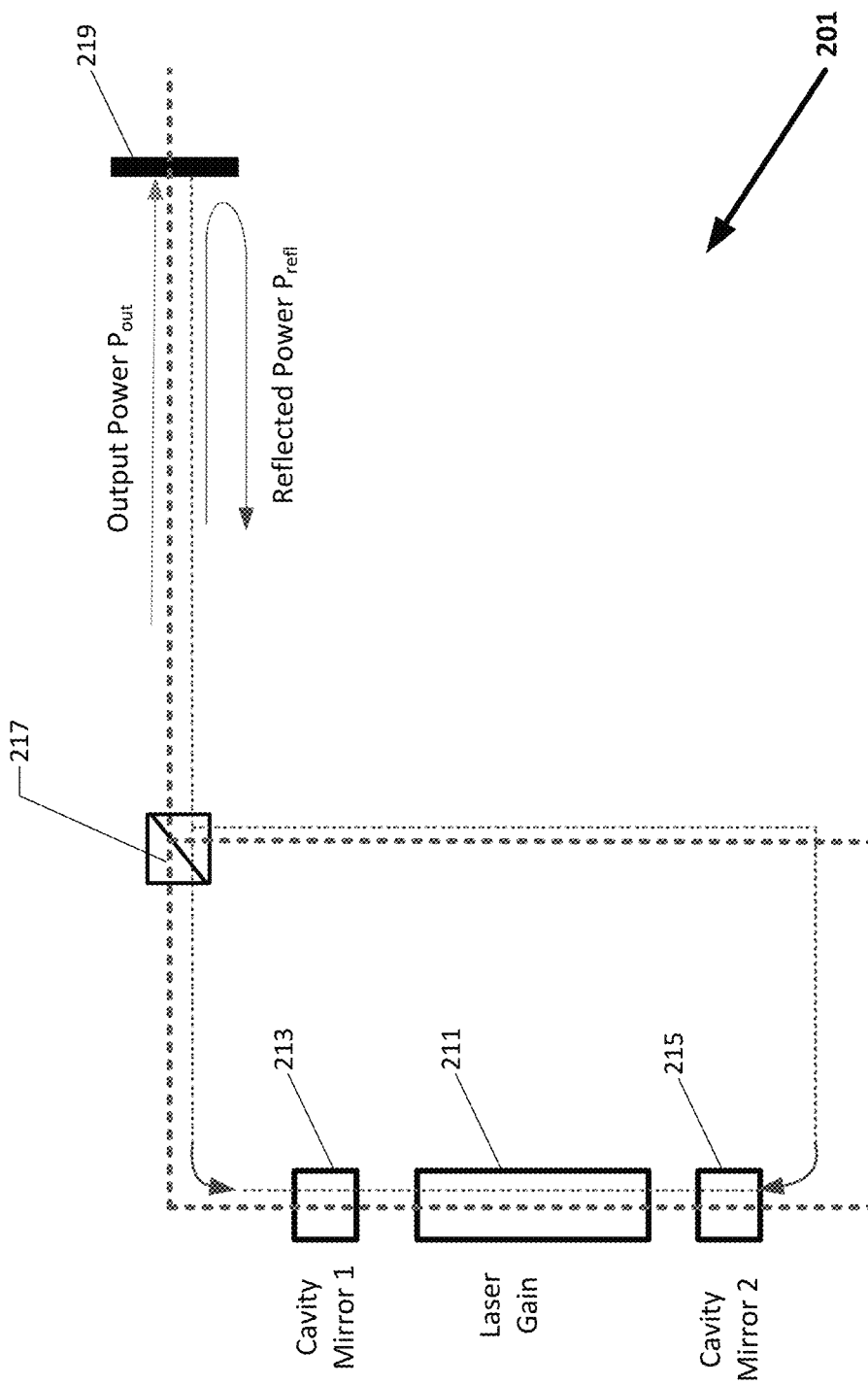
FIG. 2 is a block diagram conceptually illustrating an embodiment of the present technology for narrowing a linewidth of a laser in accordance with an aspect of the present disclosure.

For the purpose of illustration and clarity, the descriptions herein focus on one or more inventive aspects of the present technology. FIG. 2 illustrates another embodiment of the present technology in an aspect of the present disclosure. At a conceptual level, the example embodiment 201 may include at least a laser gain medium 211, a first cavity mirror 213, e.g., Cavity Mirror 1, a second cavity mirror 215, e.g., Cavity Mirror 2, a beam splitter/combiner 217, and a reflection element 219.

As mentioned above, a laser cavity is formed by the laser gain medium 211 and two cavity mirrors 213 and 215 (e.g., Cavity Mirror 1 and Cavity Mirror 2). Laser light exits both facets and is combined in the beam splitter/combiner with a variable split/combine ratio 217 and the laser light outputs as Output Power $P_{out}$. In the example, a fraction of the laser light is then be reflected back (e.g., Reflected Power $P_{refl}$) by the reflection element 219 towards the laser cavity mirrors, Cavity Mirror 1 and Cavity Mirror 2, via the beam splitter/combiner 217. The reflected light may then be split by the beam splitter/combiner 217 and enter back into the laser cavity through both cavity mirrors, Cavity Mirror 1 and Cavity Mirror 2. As such, the example embodiment 201 provides a method or technology for narrowing the linewidth of a laser by means of the optical feedback of the light output based on one or more reflection elements.

Figure 3:
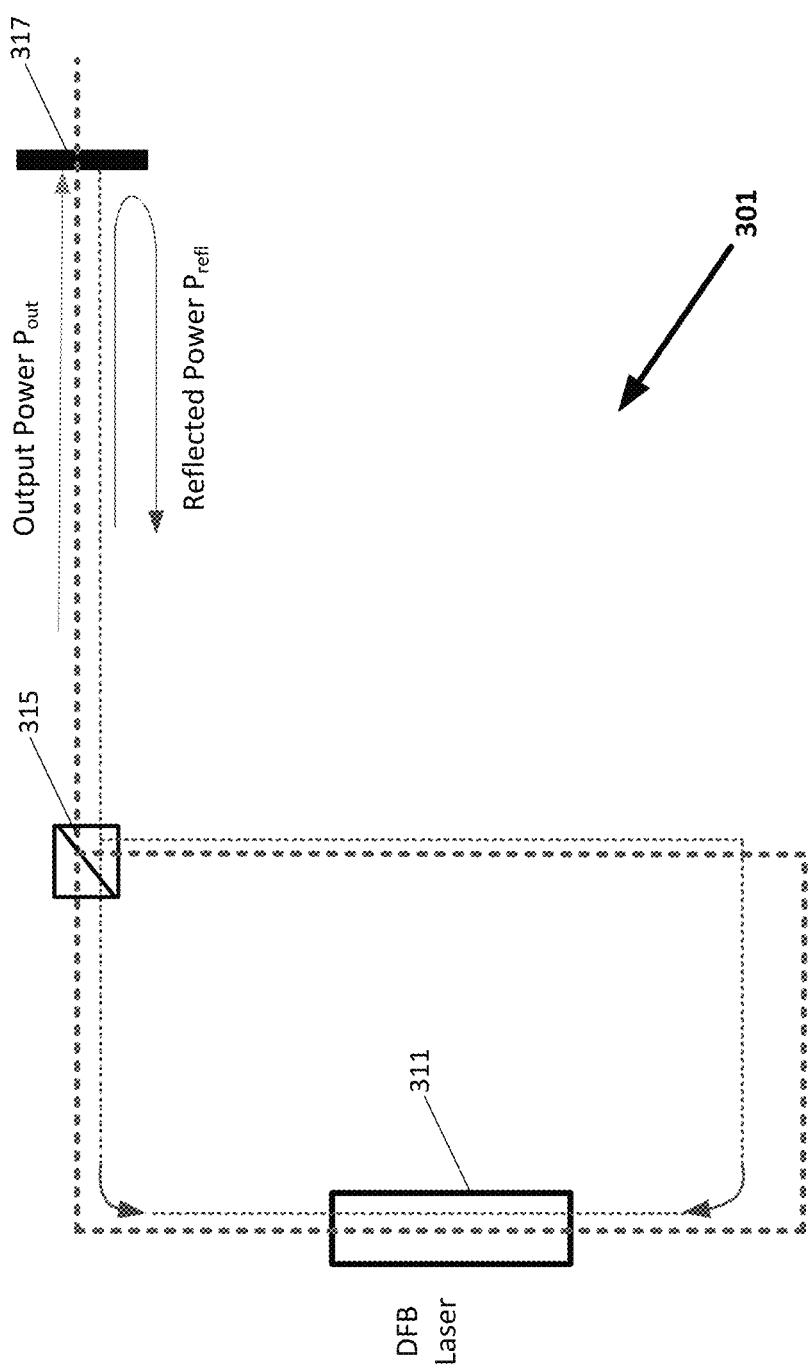
FIG. 3 is a block diagram conceptually illustrating another embodiment of the present technology for narrowing a linewidth of a laser in accordance with an aspect of the present disclosure.

FIG. 3 illustrates another embodiment of the present technology in an aspect of the present disclosure. By way of example, an embodiment 301 includes a distributed feedback (DFB) laser 311, a beam splitter/combiner 315, and a reflection element 317. In the example, the Reflected Power $P_{refl}$ is fed back into the cavity of the DFB laser via the beam splitter/combiner 315 with a variable splitter/combiner ratio. Further, the reflection element 317 may include a mirror plane for feedback reflection with a variable reflection percentage (%). As such, the example embodiment 301 provides a method or technology for narrowing the linewidth of a laser by means of the optical feedback of the light output based on one or more reflection elements.

Figure 4:
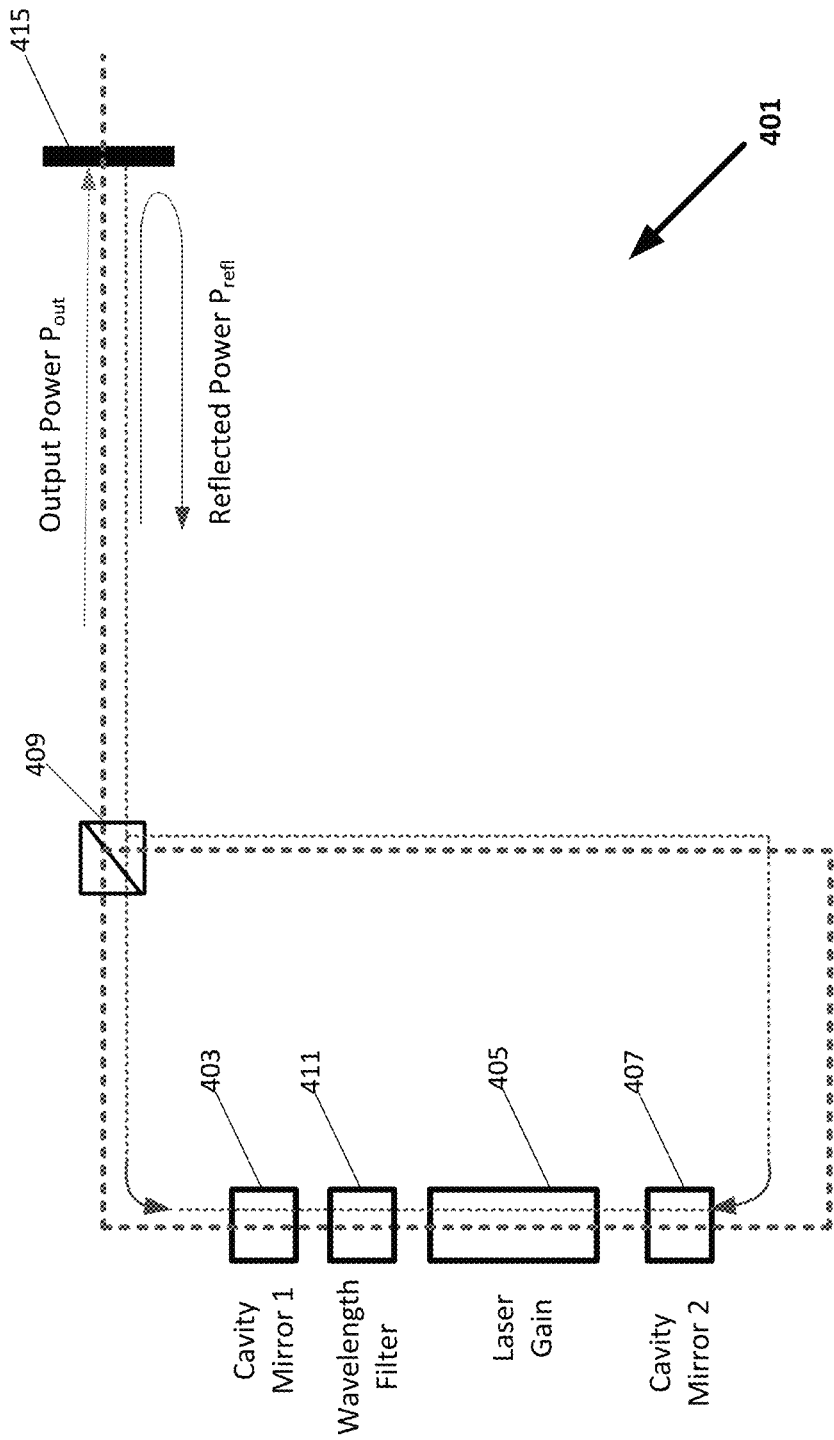
FIG. 4 is a block diagram conceptually illustrating another embodiment of the present technology for narrowing a linewidth of a laser in accordance with an aspect of the present disclosure.

FIG. 4 illustrates another example of an embodiment in accordance with an aspect of the present disclosure. By way of example, an embodiment 401 may include at least a first cavity mirror 403, a wavelength filter 411, a laser gain 405, a second cavity mirror 407, a beam splitter/combiner 409, and a reflection element 415. Compared to the previous embodiments, the embodiment 401 is configured to include the wavelength filter 411 placed inside the laser cavity between the first cavity mirror 403 (e.g., Cavity Mirror 1) and the second cavity mirror 407.

Additionally, in another aspect of the present disclosure, one or both cavity mirrors may also act as a wavelength filter element. As mentioned above, the beam splitter/combiner 409 may has a variable split/combine ratio and the reflection element 415 may be a mirror plane for feedback reflection with a variable reflection percentage (%).

In the example, laser light may exit both facets and be combined in the beam splitter/combiner with a variable split/combine ratio 409 and output as Output Power $P_{out}$. Afterwards, a fraction of the laser light may then be reflected back from the reflection element 415 as Reflected Power Pre towards the beam splitter/combiner 409. The reflected light may then be split by the beam splitter/combiner 409 and enter back into the laser cavity through both cavity mirrors, Cavity Mirror 1 and Cavity Mirror 2. Also, the wavelength filter 411 is configured to select a desired wavelength of the tunable laser. In the example and in an aspect of the present disclosure, although the wavelength filter 411 is placed between Cavity Mirror 1 and the laser gain 405, the wavelength filter 411 for single mode lasing may be included in Cavity Mirror 1 and/or Cavity Mirror 2. As such, the example embodiment 401 provides a method or technology for narrowing the linewidth of a laser by means of the optical feedback of the light output.

Figure 5:
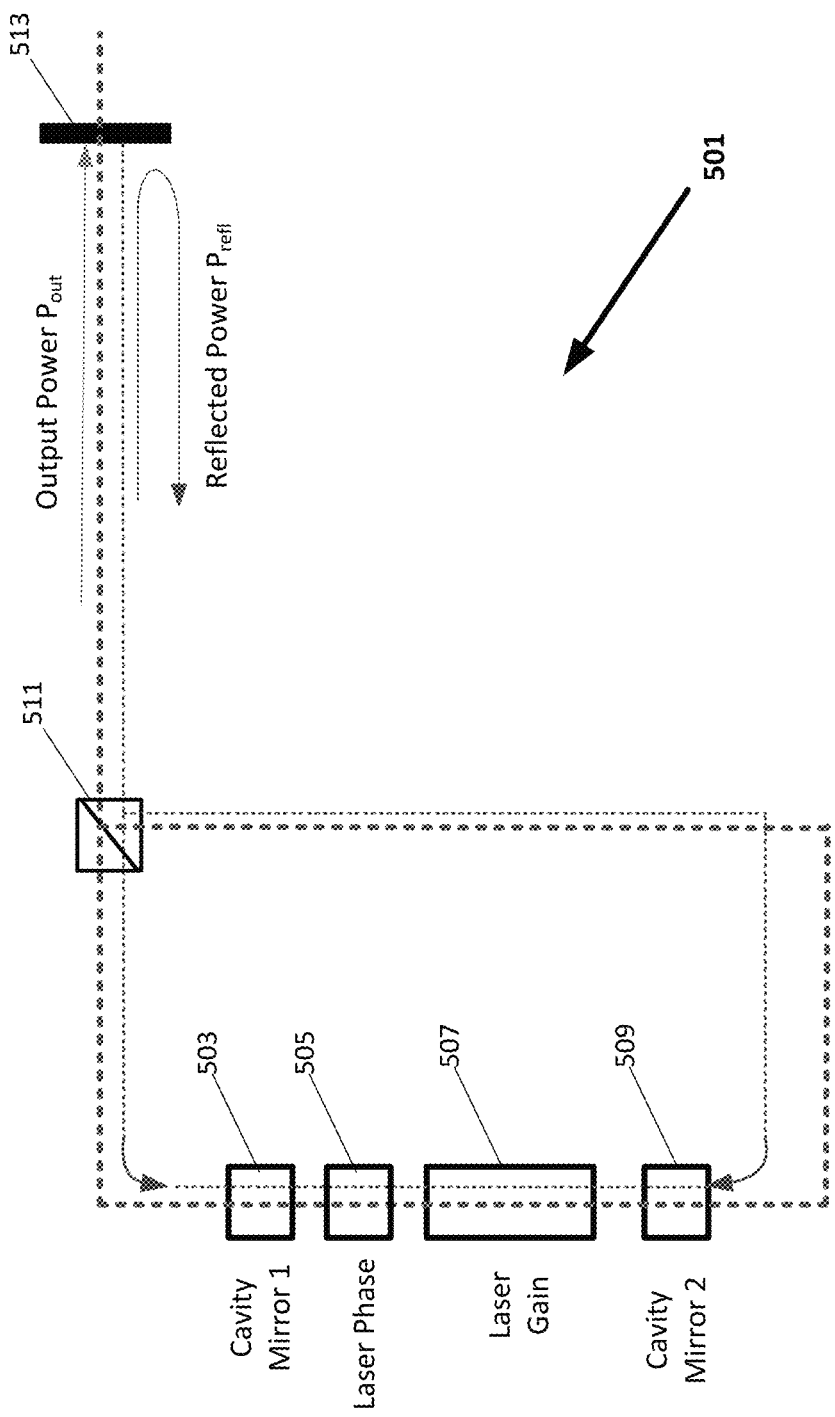
FIG. 5 is a block diagram conceptually illustrating another embodiment of the present technology for narrowing a linewidth of a laser in accordance with an aspect of the present disclosure.

FIG. 5 illustrates another example embodiment in accordance with an aspect of the present disclosure. By way of example, an embodiment 501 may include at least a first cavity mirror 503, a laser phase section 505, a laser gain 507, a second cavity mirror 509, a beam splitter/combiner 511, and a reflection element 513. The embodiment 501 is configured to include the laser phase section 505, e.g., Laser Phase, placed between the first cavity mirror 503 (e.g., Cavity Mirror 1) and the laser gain 507 but could also be placed between the second cavity mirror 509 and the laser gain 507. A laser phase tuning section may also be included in the laser cavity for precise wavelength control of laser emission. Further, as mentioned above, the beam splitter/combiner 511 has a variable split/combine ratio and the reflection element 513 has a variable reflection percentage (%).

In the example of FIG. 5, laser light exits both facets and is combined in the beam splitter/combiner 511 with a variable split/combine ratio and output as Output Power $P_{out}$. Afterwards, a fraction of the laser light may then be reflected back from the reflection element 513 as Reflected Power Pre towards the beam splitter/combiner 511. The reflected light may then be split by the beam splitter/combiner 511 and enter back into the laser cavity through both cavity mirrors, Cavity Mirror 1 and Cavity Mirror 2. As such, the example embodiment 501 provides a method or technology for narrowing the linewidth of a laser by means of the optical feedback of the light output.

Figure 6:
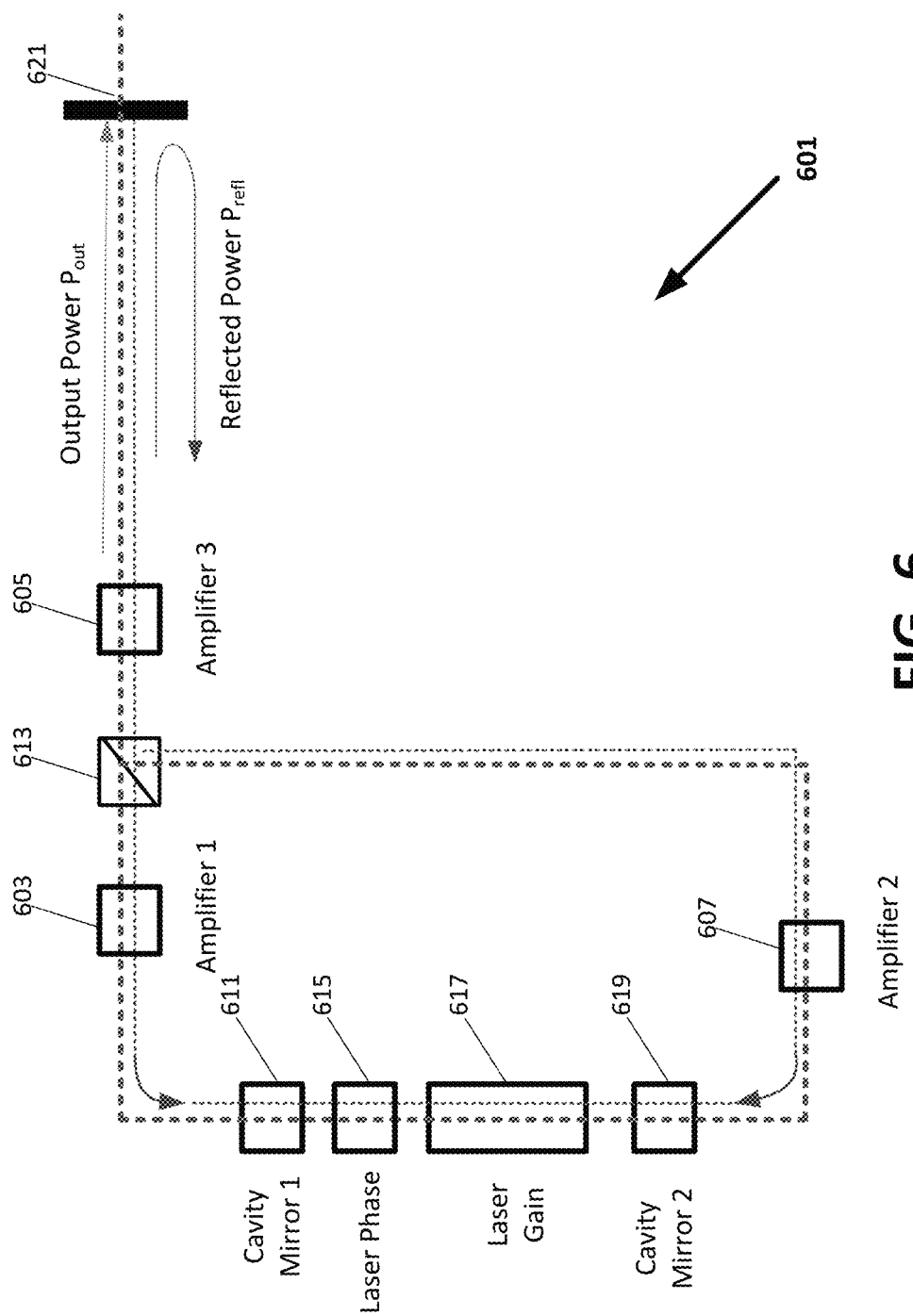
FIG. 6 is a block diagram conceptually illustrating another embodiment of the present technology for narrowing a linewidth of a laser in accordance with an aspect of the present disclosure.

FIG. 6 illustrates another example of an embodiment in accordance with an aspect of the present disclosure. The embodiment 601 of FIG. 6 is similar to the embodiment of FIG. 5 but includes a plurality of optical amplifiers. In FIG. 6, the embodiment 601 may be configured to include one or more optical amplifiers such as a first amplifier 603, e.g., Amplifier 1, a second amplifier 607, e.g., Amplifier 2, and a third amplifier 605, e.g., Amplifier 3 at various locations. In an aspect of the present disclosure, the first amplifier 603 may be placed between a first cavity mirror 611, e.g., Cavity Mirror 1, and a beam splitter/combiner 613, the third amplifier 605 may be placed between the beam splitter/combiner 613 and a reflection element 621 which is disposed at a predetermined distance. The second amplifier 607 may be disposed between the beam splitter/combiner 613 and the second cavity mirror 619, e.g., Cavity Mirror 2.

In the embodiment 601, the laser light is amplified by one or more optical amplifiers either before combining of the optical paths (e.g., via amplifier 1 and amplifier 2) or after combining of the optical paths (e.g., via amplifier 3) from the cavity mirrors, e.g., Cavity Mirror 1 and Cavity Mirror 2. That is, as shown in FIG. 6, the optical amplifiers 1 and 2 may be placed and used to amplify the laser output before the combination of the optical paths via the beam splitter/combiner 613 and by amplifier 3 after the combination of the optical paths via the beam splitter/combiner 613. Further, in the example, the optical amplifiers such as amplifiers 1, 2, and 3 may be semiconductor optical amplifiers (SOAs) or other kinds of optical amplifiers.

Furthermore, in the embodiment 601, an optical feedback into both cavity mirrors (e.g., Cavity Mirror 1 and Cavity Mirror 2) may be accomplished by a reflection element 621. Also, in the example, a laser phase 615 is placed between the first cavity mirror 611 and the laser gain 617 but may as well be placed between the second cavity mirror 619 and the laser gain 617. In another aspect of the present disclosure, for example, the first cavity mirror 611, e.g., Cavity Mirror 1, and/or second cavity mirror 619, e.g., Cavity Mirror 2, may include a wavelength filter element (e.g., a wavelength filter) for single mode operation.

In the embodiment 601, laser light may exit both facets and be combined in the beam splitter/combiner 613 with a variable split/combine ratio and output as Output Power $P_{out}$. A fraction of the laser light may then be reflected back by the reflection element 621 as Reflected Power Pre towards the beam splitter/combiner 613. The reflected light may then be split by the beam splitter/combiner 613 and the reflected light enters back into the laser cavity through both cavity mirrors, Cavity Mirror 1 and Cavity Mirror 2. As such, the embodiment 601 provides a method or technology for narrowing the linewidth of a laser by means of the optical feedback of the light output, a reflection element and one or more optical amplifiers.

Figure 7:
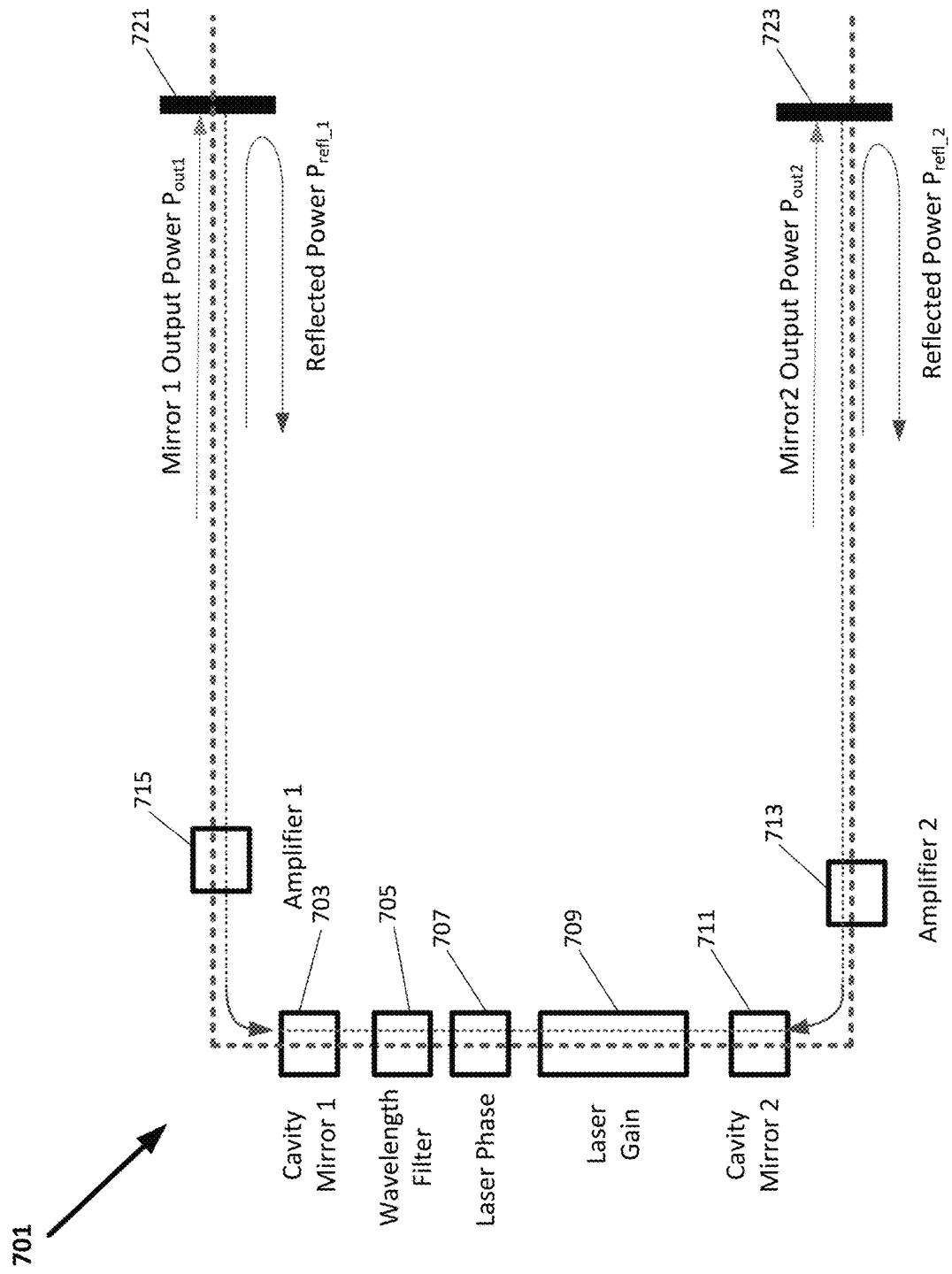
FIG. 7 is a block diagram conceptually illustrating another embodiment of the present technology for narrowing a linewidth of a laser in accordance with an aspect of the present disclosure.

FIG. 7 illustrates another example embodiment in accordance with an aspect of the present disclosure. An embodiment 701 includes at least a first reflection element 721, a first amplifier 715, a first cavity mirror 703, a wavelength filter 705, a laser phase 707, a laser gain 709, a second cavity mirror 711, a second amplifier 713, and a second reflection element 723. In the example, the wavelength filter 705 is coupled to the first cavity mirror 703. The first amplifier 715 is an optical amplifier configured to amplify the light emitted from the first cavity mirror 703 and the second amplifier 713 is another optical amplifier configured to amplify the light emitted from the second cavity mirror 711. Further, the light amplified via the first amplifier 715 is output as Mirror 1 Output Power $P_{out1}$ and is reflected back at the reflection element 721 as Reflected Power $P_{refl\_1}$. The light emitted from the second cavity mirror 711 and amplified by the second amplifier 713 is emitted as Mirror 2 Output Power $P_{out2}$ and reflected at the reflection element 723 as Reflected Power $P_{refl\_2}$. The reflection elements 721 and 723 are disposed at a predetermined distance away from the first cavity mirror 703 and the second cavity mirror 713, respectively.

In another aspect of the present disclosure, at least one optical amplifier (e.g., Amplifier 1 and/or Amplifier 2) may be used after each cavity mirror to amplify the laser output (e.g., Mirror 1 Output Power $P_{out1}$ and Mirror 2 Output Power $P_{out2}$) and the reflected feedback light (e.g., Reflected Power $P_{refl\_1}$, $P_{refl\_2}$) from the two reflection elements 721 and 723 (e.g., mirror plane 1 and mirror plane 2). As such, the example embodiment 701 provides a method or technology for narrowing the linewidth of a laser by means of the optical feedback of the light output, two reflection elements and two optical amplifiers.

Figure 8:
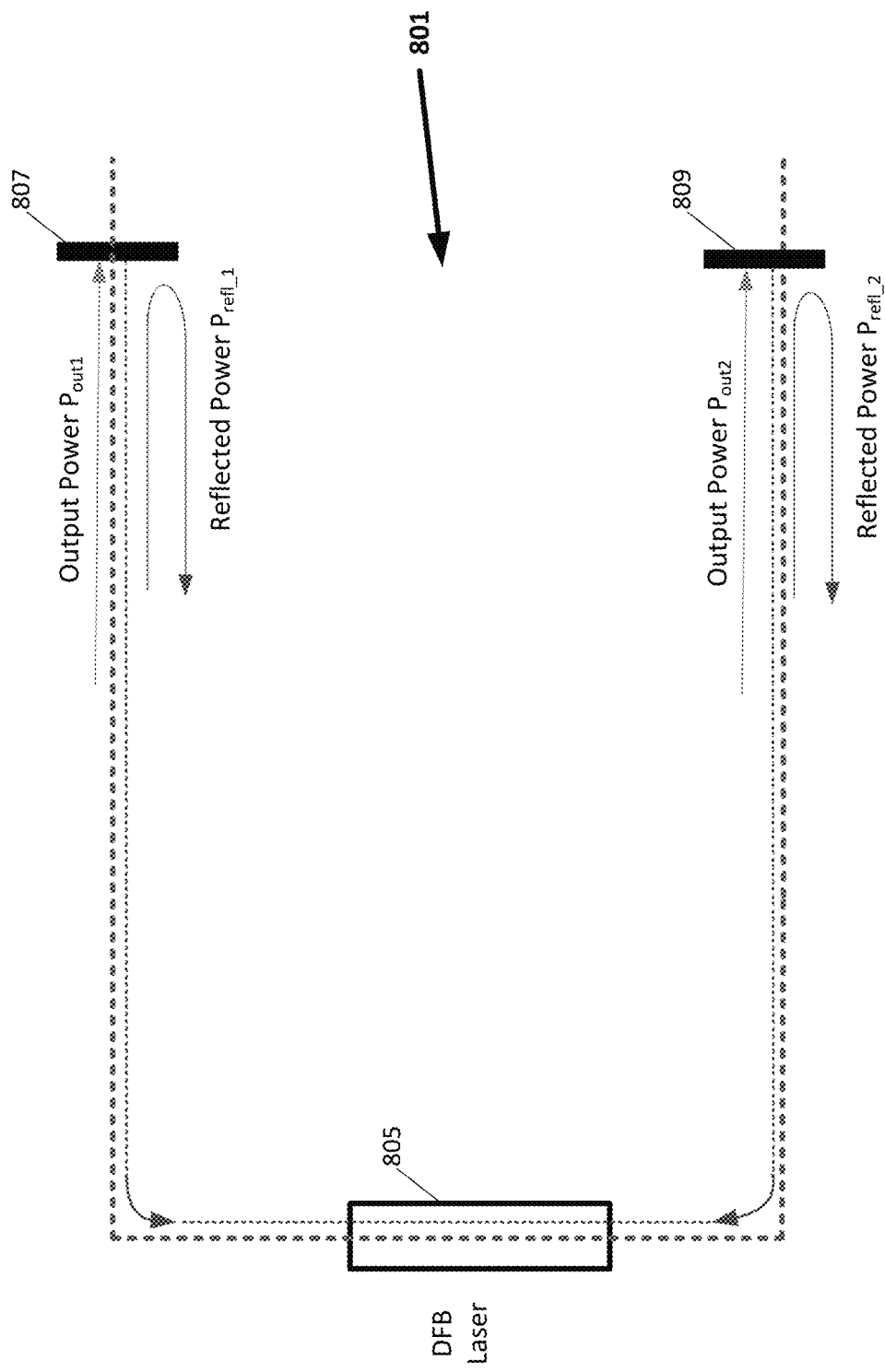
FIG. 8 is a block diagram conceptually illustrating another embodiment of the present technology for narrowing a linewidth of a laser in accordance with an aspect of the present disclosure.

FIG. 8 illustrates another example embodiment in accordance with an aspect of the present disclosure. In the embodiment 801, a distributed feedback (DFB) laser 805 and two reflections elements 807 and 809 may be used. The two reflection elements 807 and 809 may include a mirror plane 1 and a mirror plane 2, which are used to reflect a portion of the output power as reflected power with a variable reflection percentage (%). In the example, both the reflected power ($P_{refl\_1}$ and $P_{refl\_2}$) from the reflection element 807 and the reflection element 809 are fed back into the DFB laser 805. As such, the example embodiment 801 provides a method or technology for narrowing the linewidth of a DFB laser by means of the optical feedback of the light output and two reflection elements.

Figure 9:
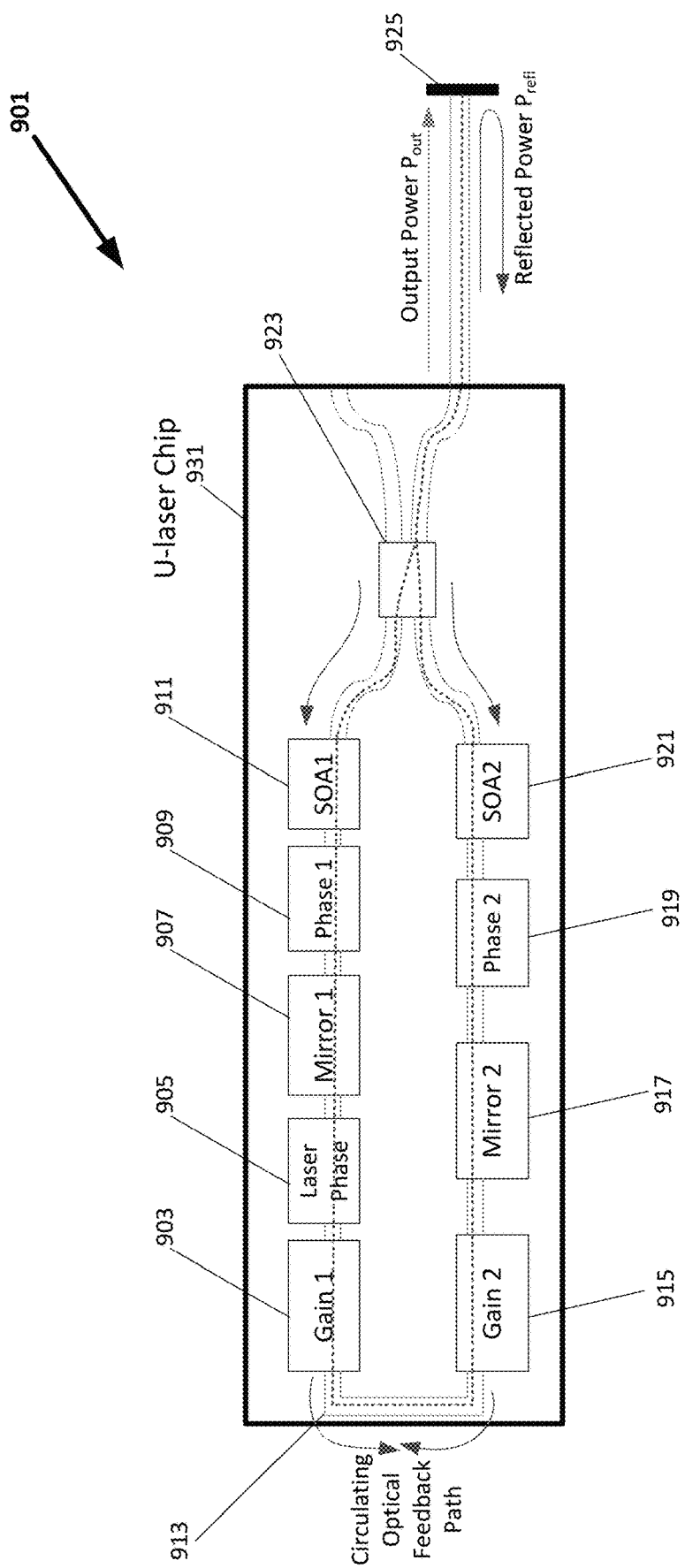
FIG. 9 is a block diagram conceptually illustrating another embodiment of the present technology for narrowing a linewidth of a laser in accordance with an aspect of the present disclosure.

FIG. 9 illustrates another embodiment in accordance with an aspect of the present disclosure. The embodiment 901, which is similar to the embodiment of FIG. 1, does not include power monitor units inside a U-laser chip 931. In the example, the embodiment 901 may include an SG-DBR tunable U-laser with phase control sections 909 and 919 (e.g., Phase 1 and Phase 2) and optical amplifiers 911 and 921 (e.g., SOA1 and SOA2). In particular, the U-laser chip 931 is configured to include a first gain 903, a laser phase 905, a first mirror 907, a first phase control section 909, a first amplifier 911, a waveguide 913, a second gain 915, a second mirror 917, a second phase control section 919, a second amplifier 921, a beam splitter/combiner 923, and a reflection element 925. In the example, the waveguide 913 may include a U-shaped waveguide and coupled to the first gain 903 and the second gain 915. The laser phase 905 is placed between the first gain 903 and the first mirror 907, and the first phase 909 is placed between the first mirror 907 and the first amplifier 911. The second mirror 917 is placed between the second gain 915 and the second phase 919. The first amplifier 911 and the second amplifier 921 are coupled to the beam splitter/combiner 923, at which the light is combined and output as the laser output power, Output Power $P_{out}$ and is reflected back as Reflected Power Pre at the reflection element 925, which may include a mirror plane. As such, the example embodiment 901 provides a method or technology for narrowing the linewidth of a laser by means of the optical feedback of the light output and a reflection element.

Figure 10:
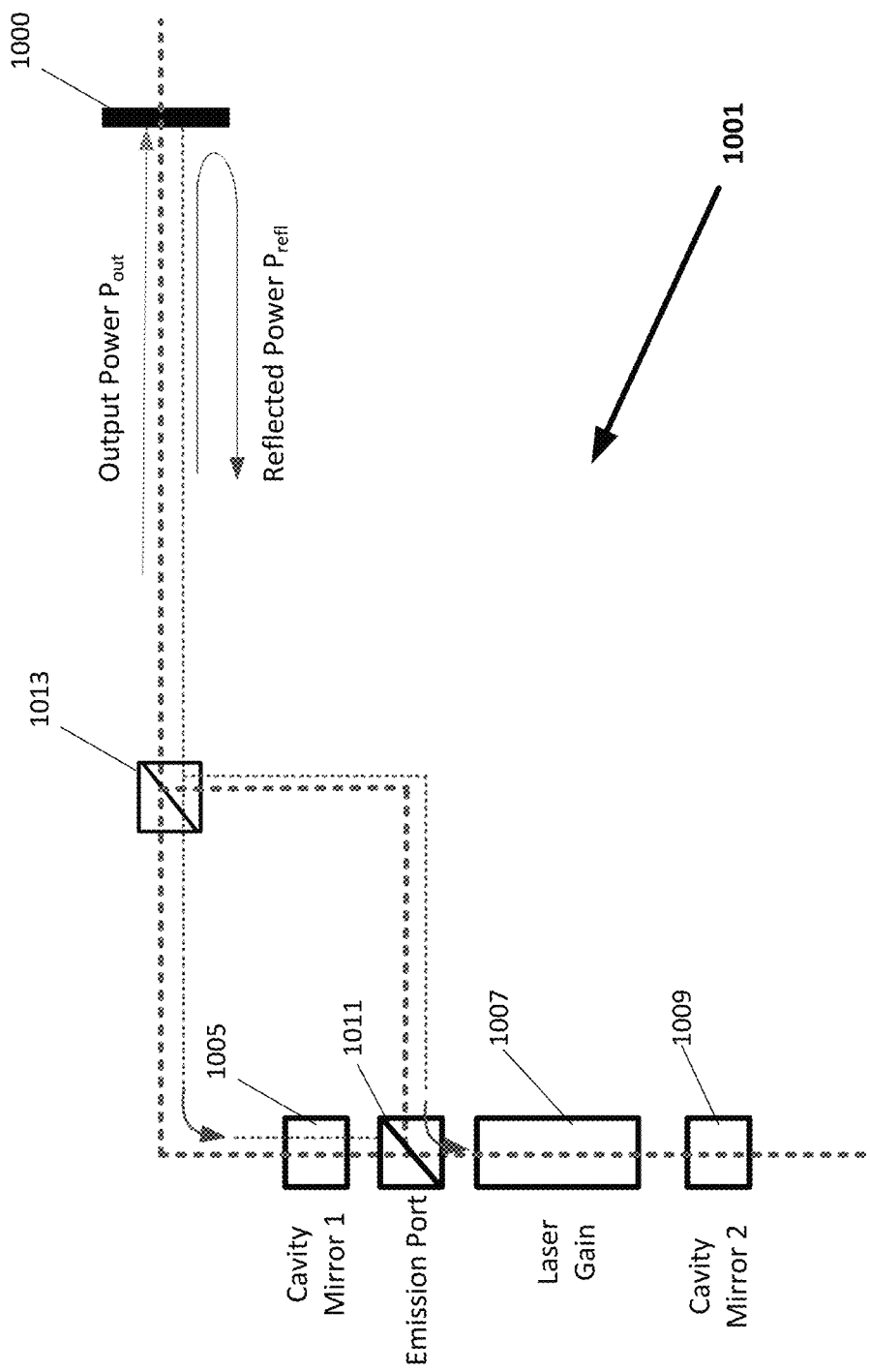
FIG. 10 is a block diagram conceptually illustrating another embodiment of the present technology for narrowing a linewidth of a laser in accordance with an aspect of the present disclosure.

FIG. 10 illustrates another example of an embodiment in accordance with an aspect of the present disclosure. An embodiment 1001 may include at least a first cavity mirror 1005, an emission port 1011, a laser gain 1007, a second cavity mirror 1009, a beam splitter/combiner 1013, and a reflection element 1000. In the example, the laser cavity may include the emission port 1011 placed between the first cavity mirror 1005 and the laser gain 1007 (e.g., Emission Port between Cavity Mirror 1 and Laser Gain). Also, the laser output is emitted as an output power, Output Power $P_{out}$, through the beam splitter/combiner 1013 and an optical feedback may be injected back into the laser cavity as reflected power, e.g., reflected power $P_{refl}$, through the first cavity mirror 1005 (e.g., Cavity Mirror 1) and the emission port 1011 (e.g., Emission Port). As such, the optical feedback may be made into the laser cavity after being reflected by the single reflection element 1000 (e.g., a mirror plane). As such, the example embodiment 1001 provides a method or technology for narrowing the linewidth of a laser by means of the optical feedback of the light output.

Figure 11:
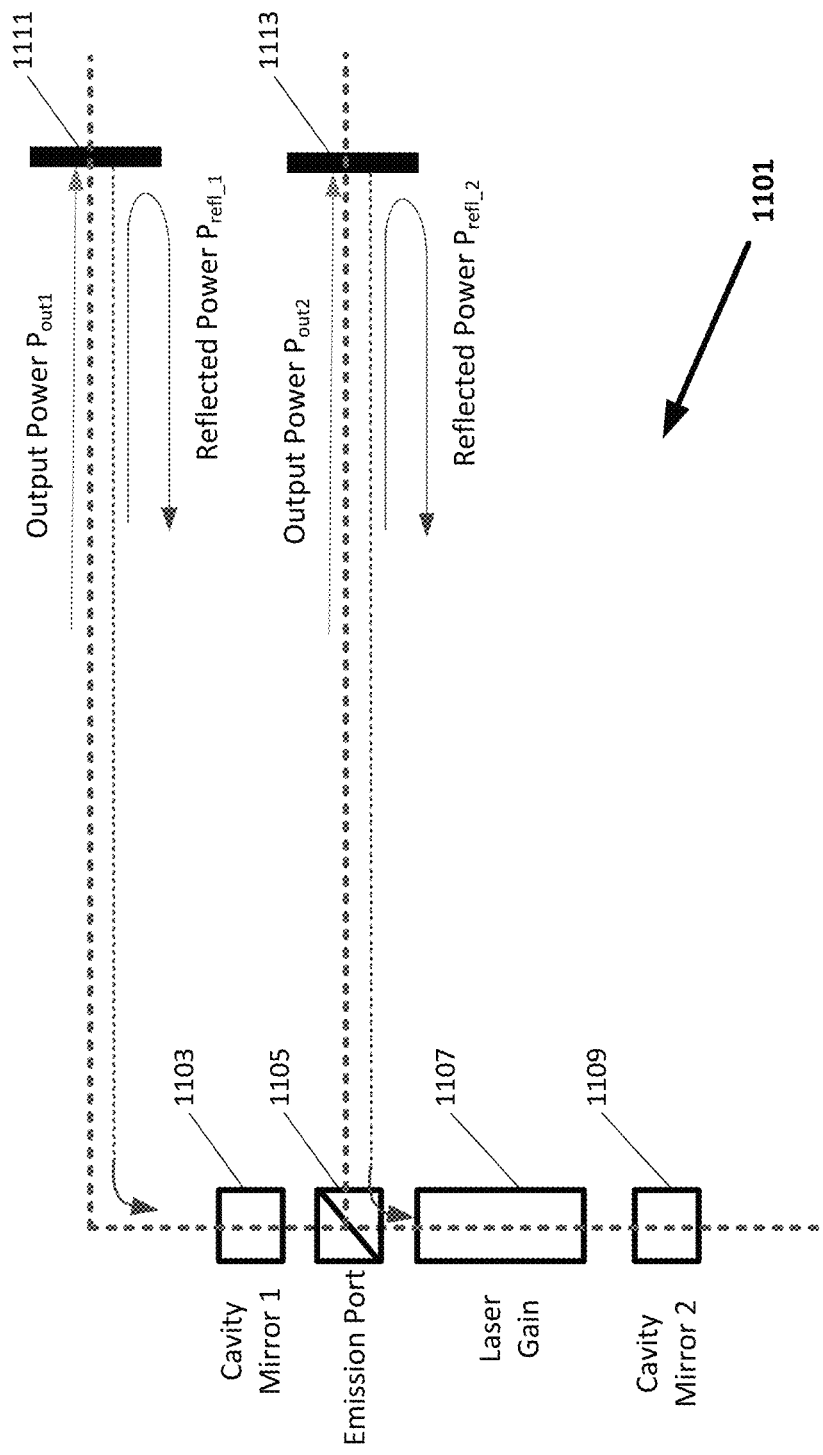
FIG. 11 is a block diagram conceptually illustrating another embodiment of the present technology for narrowing a linewidth of a laser in accordance with an aspect of the present disclosure.

FIG. 11 illustrates another example of an embodiment in accordance with an aspect of the present disclosure. In an aspect of the present disclosure, an embodiment 1101 may include two reflection elements but do not include any beam splitter/combiner in the optical path. In FIG. 11, the embodiment 1101 is configured to include a first cavity mirror 1103, an emission port 1105, a laser gain 1107, a second cavity mirror 1109, a first reflection element 1111, and a second reflection element 1113. The emission port 1105 is placed between the first cavity mirror 1103 and the laser gain 1107. Further, first light is output as first output power, Output Power $P_{out1}$, which is reflected back into the first cavity mirror 1103 via the reflection element 1111 and second light is output as second output power, Output Power $P_{out2}$, which is reflected back into the emission port 1105. As such, the optical feedback forced into the first cavity mirror 1103 (e.g., Cavity Mirror 1) and the emission port 1105 (e.g., Emission Port disposed between Cavity Mirror 1 and Laser Gain) may be made by the two different reflection elements 1111 and 1113 as Reflected Power $P_{refl\_1}$, $P_{refl\_2}$. As such, the example embodiment 1101 provides a method or technology for narrowing the linewidth of a laser by means of the optical feedback of the light output and two reflection elements.

Figure 12:
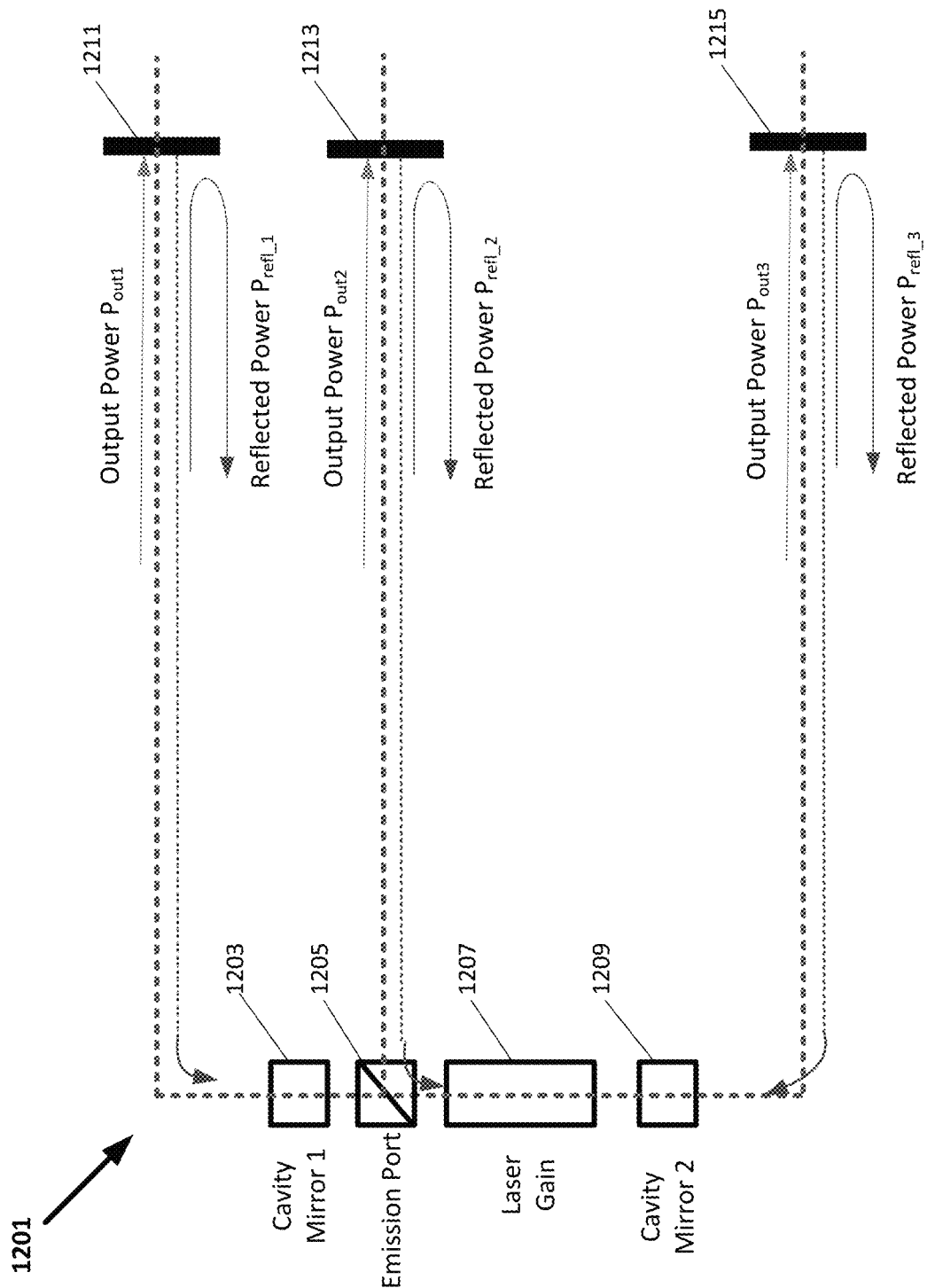
FIG. 12 is a block diagram conceptually illustrating another embodiment of the present technology for narrowing a linewidth of a laser in accordance with an aspect of the present disclosure.

FIG. 12 illustrates another example embodiment in accordance with an aspect of the present disclosure. In the example, an embodiment 1201 is configured to include at least a first cavity mirror 1203, an emission port 1205, a laser gain 1207, a second cavity mirror 1209, a first reflection element 1211, a second reflection element 1213, and a third reflection element 1215. The emission port 1205 is disposed between the first cavity mirror 1203 and the laser gain 1207. First output power is output from the first cavity mirror 1203 and is reflected back into the first cavity mirror 1203 via the first reflection element 1211 as first reflected power $P_{refl\_1}$. Second output power is output from the cavity emission port 1205 and is reflected back into the emission port 1205 as second reflected power $P_{refl\_2}$, via the second reflection element 1213. Third output power is output from the second cavity mirror 1209 and is reflected back into the second cavity mirror 1209 as third reflected power $P_{refl\_3}$, via the third reflection element 1215.

As such, the optical feedback into the cavity mirrors (e.g., Cavity Mirror 1 and Cavity Mirror 2) and emission port (e.g., emission port placed between Cavity Mirror 1 and Laser gain) may be made by three different reflection elements 1211, 1213, and 1215 (e.g., mirror planes), which are placed at predetermined distances away from the first cavity mirror 1203, the emission port 1205, and the second cavity mirror 1209. Each reflection element 1211, 1213, or 1215 may include a mirror plane for feedback reflection with a variable reflection percentage (%). As such, the example embodiment 1201 provides a method or technology for narrowing the linewidth of a laser by means of the optical feedback of the light output and three reflection elements.

Figure 13:
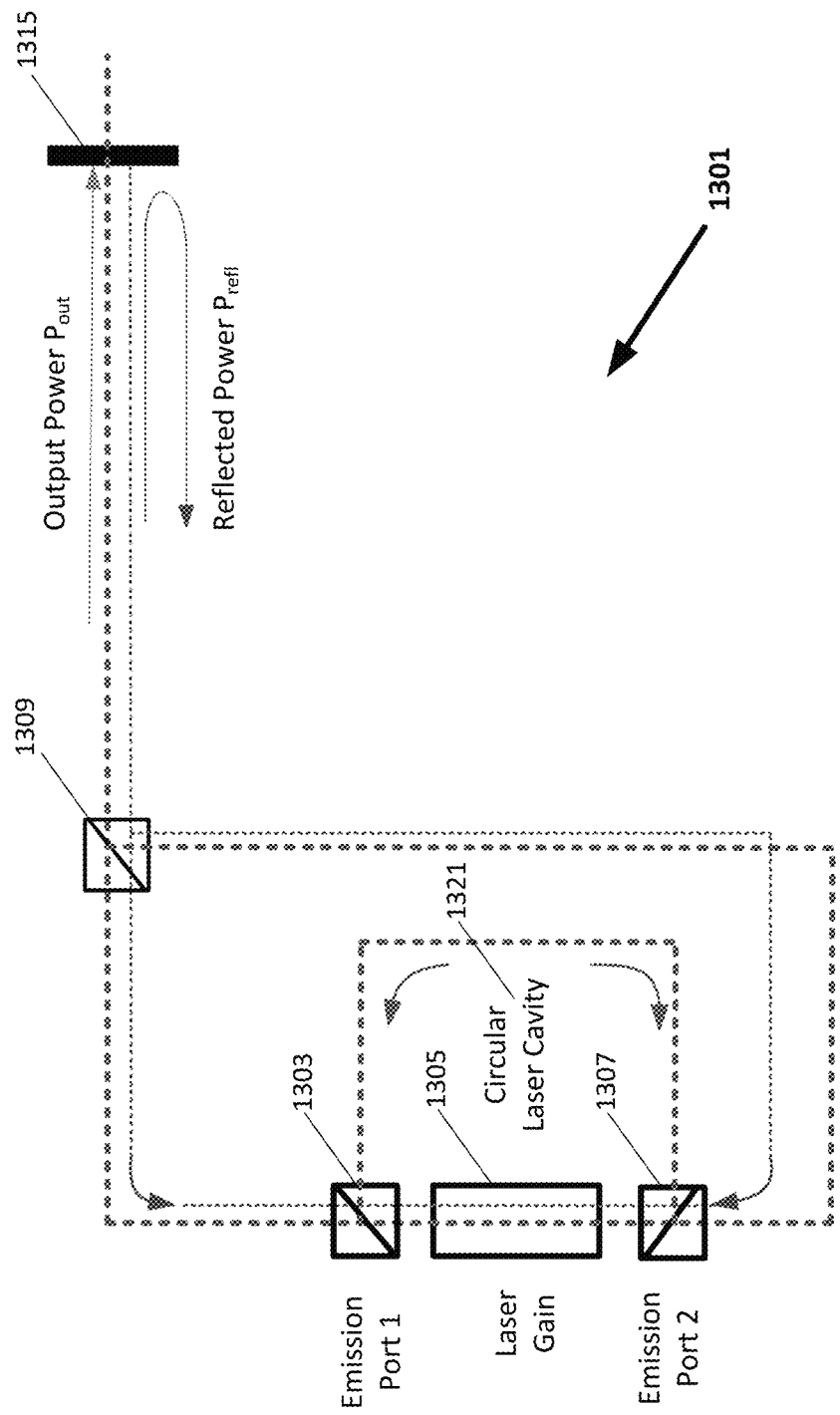
FIG. 13 is a block diagram conceptually illustrating another embodiment of the present technology for narrowing a linewidth of a laser in accordance with an aspect of the present disclosure.

FIG. 13 illustrates another example embodiment in accordance with an aspect of the present disclosure. In an aspect of the present disclosure, the embodiment 1301 includes a circular laser cavity which includes at least a first emission port 1303, a laser gain 1305, a second emission port 1307. The embodiment 1301 further includes a beam splitter/combiner 1309 and a reflection element 1315. From an operational perspective, the laser light is output as an output power, Output Power $P_{out}$ and is feedback by the reflection element 1315 as Reflected Power $P_{refl}$. That is, in an aspect of the present disclosure, the laser cavity may be a circular cavity in which optical emission and optical feedback injection may be achieved through two emission ports such as Emission Port 1 and Emission Port 2. In the example, the optical paths are combined via the beam splitter/combiner 1309 before the reflection element 1315 (e.g., a mirror plane) such that the optical feedback may be made by the single reflection element 1315. The beam splitter/combiner 1309 has a variable split/combine ratio, which may be predetermined. The reflection element 1315 may be a mirror plane for feedback reflection with a variable reflection percentage (%). Thus, the example embodiment 1301 provides a method or technology for narrowing the linewidth of a laser by means of the optical feedback of the light output and a reflection element.

Figure 14:
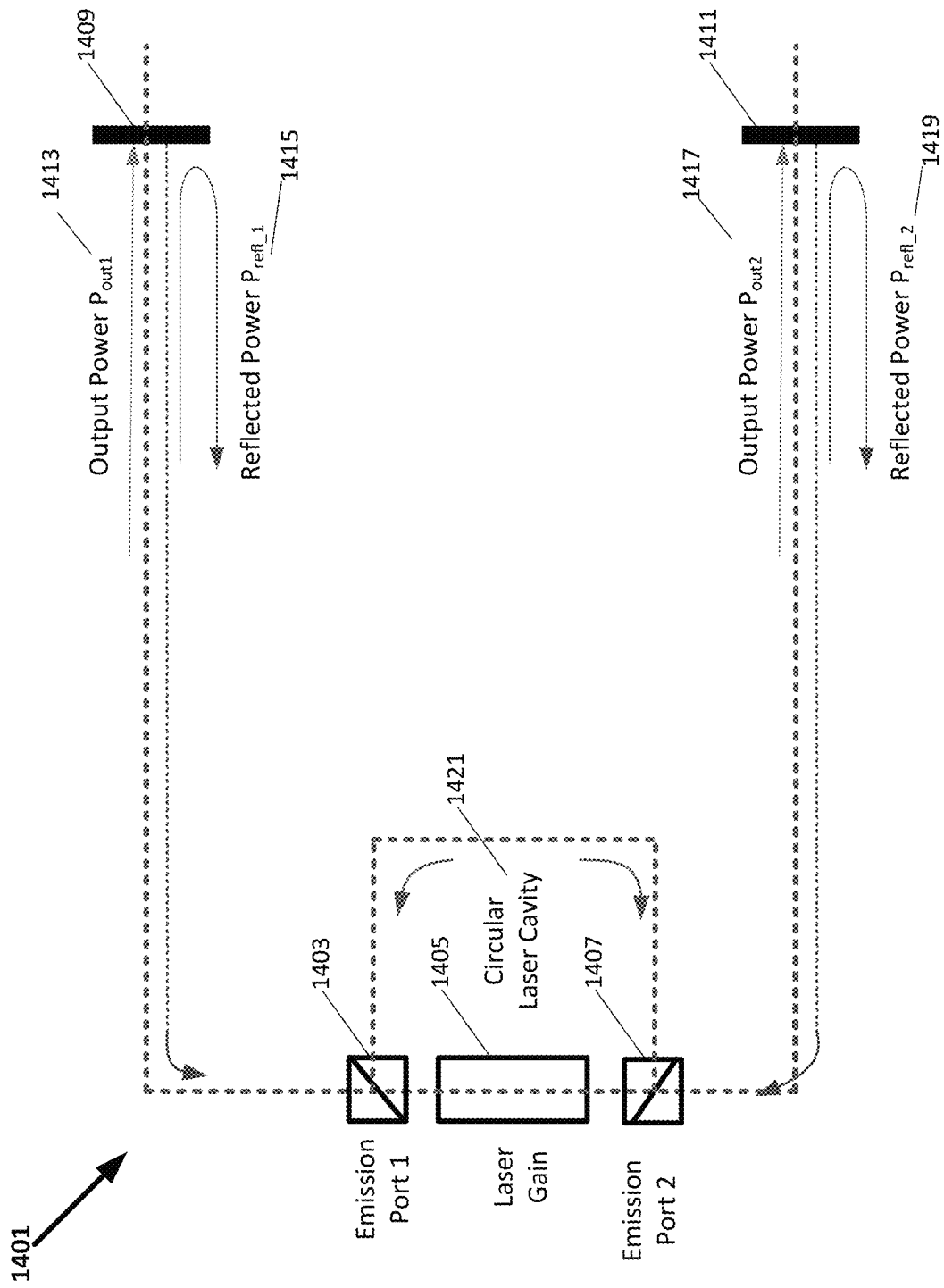
FIG. 14 is a block diagram conceptually illustrating another embodiment of the present technology for narrowing a linewidth of a laser in accordance with an aspect of the present disclosure.

FIG. 14 illustrates another example embodiment 1401 in accordance with an aspect of the present disclosure. In the example, the laser cavity may be a circular cavity and the emission ports are implemented to tap off power from the laser cavity. In particular, the embodiment 1401 is configured to include a circular laser cavity 1421 comprising a first emission port 1403, a laser gain 1405, and a second emission port 1407, and two reflection elements 1409 and 1411 (e.g., Mirror planes). Further, the embodiment 1401 includes the first reflection element 1409 by which first Output Power $P_{out1}$ 1413 is reflected as first Reflected Power $P_{refl\_1}$ 1415 towards the first emission port 1403. The embodiment 1401 also includes the second reflection element 1411 by which second Output Power $P_{out2}$ 1417 is reflected as second Reflected Power $P_{refl\_2}$ 1419 towards the second emission port 1407. As such, the optical feedback is made and injected into the first emission port 1403 and the second emission port 1407 by two different reflection elements 1409 and 1411. In one implementation, the reflection elements 1409 and 1411 may include mirror planes, each of which includes feedback reflection with a variable reflection percentage (%). As such, the example embodiment 1401 provides a method or technology for narrowing the linewidth of a laser by means of the optical feedback of the light output and two reflection elements.

Figure 15:
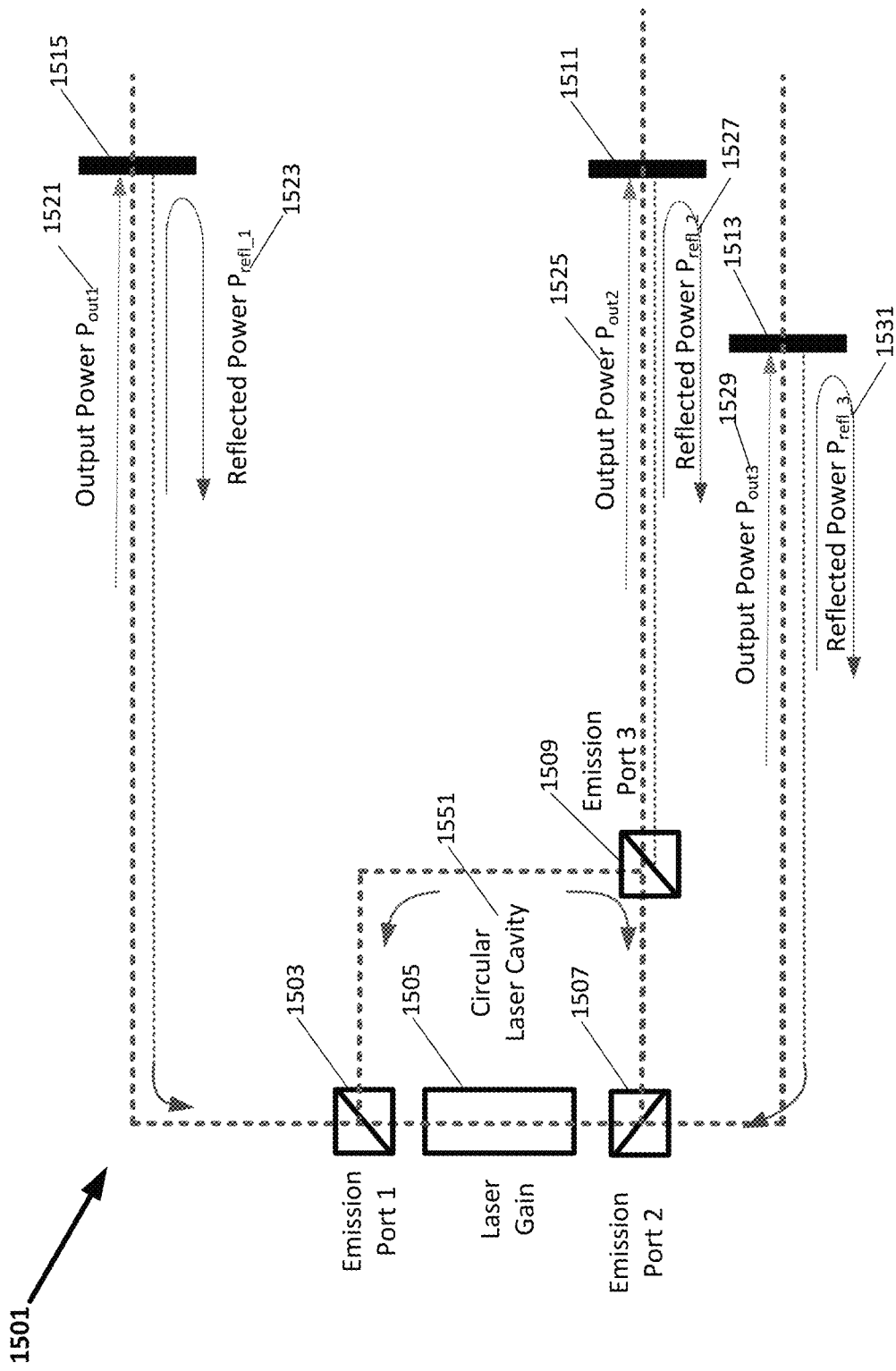
FIG. 15 is a block diagram conceptually illustrating another embodiment of the present technology for narrowing a linewidth of a laser in accordance with an aspect of the present disclosure.

FIG. 15 illustrates another example embodiment in accordance with an aspect of the present disclosure. The embodiment 1501 is configured to include at least a first emission port 1503, a laser gain 1505, a second emission port 1507, a third emission port 1509, a first reflection element 1515, a second reflection element 1511, and a third reflection element 1513. Further, a laser cavity 1551 is a circular cavity with the laser gain 1505 and comprises the first emission port 1503, the second emission port 1507 and the third emission port 1509. The first laser output may be made by the first emission port 1503 and is reflected back by the first reflection element 1515.

In FIG. 15, the first laser Output Power $P_{out1}$ 1521 is coupled out of the laser cavity through the first emission port 1503 and fed back (or reflected back) by the reflection element 1515 as Reflected Power $P_{refl\_1}$ 1523 into the first emission port 1503. The second laser Output Power $P_{out2}$ 1525 may be made by the third emission port 1509 and a fraction of the output power is fed back (or reflected back) by the reflection element 1511 as Reflected Power $P_{refl\_2}$ 1527 into the third emission port 1509. The third laser Output Power $P_{out3}$ 1529 may be made by the second emission port 1507 and fed back (or reflected back) by the reflection element 1513 as Reflected Power $P_{refl\_3}$ 1531 into the second emission port 1507. As such, as shown in FIG. 15, the optical feedback may be made into the first emission port 1503, the second emission port 1507 and the third emission port 1509 by three different reflection elements 1515, 1511 and 1513. In one implementation, the reflection elements 1515, 1511, and 1513 may include mirror planes, each of which includes feedback reflection with a variable reflection percentage (%).

Further, as mentioned above, the embodiment 1501 may include a circular laser cavity including Emission Port 1, Laser Gain, Emission Port 2 and Emission Port 3. Each of the three different reflection elements 1511, 1513, and 1515 may include a mirror plane for feedback reflection with a variable reflection percentage (%). As such, the optical feedback may be made and injected back into the laser cavity via the three different reflection elements 1511, 1513, and 1515, each of which may be placed at a predetermined distance. Thus, the example embodiment 1501 provides a method or technology for narrowing the linewidth of a laser by means of the optical feedback of the light output and three reflection elements.

As shown above, in various aspects of the present disclosure, there are various methods, techniques or arrangements, for controlling optical feedback into a laser cavity to narrow the laser linewidth using one or more reflection elements. The present technology is not limited to the disclosed embodiments herein, and other embodiments and variations are also possible.

Furthermore, although the present technology has been described with respect to an application and use in a design of an optical or communication device, various aspects of the present technology may be used in other application areas such as tunable diode laser absorption spectroscopy (TDLAS) and other areas, where the narrow laser linewidth and the wavelength tunability are needed. TDLAS is a technique used to detect traces of gasses at very low concentrations in industrial processes. Another application area is optical frequency-domain reflectometry (OFDR), which is used for sensing, e.g., strain and/or temperature along a fiber.

As such, many other variants of the present technology may be implemented in accordance with various aspects of the present technology, and thus leading to a further narrowing of a linewidth of a laser by injecting optical feedback into a laser cavity of the laser. As a result, the linewidth of the laser may be narrowed for different applications including applications supporting high order signal modulation formats. Further, by eliminating optical isolators in a package of a laser and using one or more reflection elements, the linewidth of the laser may be improved and the total cost of manufacturing of the laser may be reduced.

A singular form may include a plural form if there is no clearly opposite meaning in the context. Also, as used herein, the article "a" is intended to include one or more items. Further, no element, act, step, or instruction used in the present disclosure should be construed as critical or essential to the present disclosure unless explicitly described as such in the present disclosure. As used herein, except explicitly noted otherwise, the term "comprise" and variations of the term, such as "comprising," "comprises," and "comprised" are not intended to exclude other additives, components, or steps. The terms "first," "second," and so forth used herein may be used to describe various components, but the components are not limited by the above terms. The above terms are used only to discriminate one component from other components, without departing from the scope of the present disclosure. Also, the term "and/or" as used herein includes a combination of a plurality of associated items or any item of the plurality of associated items. Further, it is noted that when it is described that an element is "coupled" or "connected" to another element, the element may be directly coupled or directly connected to the other element, or the element may be coupled or connected to the other element through a third element. A singular form may include a plural form if there is no clearly opposite meaning in the context. In the present disclosure, the term "include" or "have" as used herein indicates that a feature, an operation, a component, a step, a number, a part or any combination thereof described herein is present. Further, the term "include" or "have" does not exclude a possibility of presence or addition of one or more other features, operations, components, steps, numbers, parts or combinations. Furthermore, the article "a" as used herein is intended to include one or more items. Moreover, no element, act, step, or instructions used in the present disclosure should be construed as critical or essential to the present disclosure unless explicitly described as such in the present disclosure.

Although the present technology has been illustrated with specific examples described herein for purposes of describing example embodiments, it is appreciated by one skilled in the relevant art that a wide variety of alternate and/or equivalent implementations may be substituted for the specific examples shown and described without departing from the scope of the present disclosure. As such, the present disclosure is intended to cover any adaptations or variations of the examples and/or embodiments shown and described herein, without departing from the spirit and the technical scope of the present disclosure.

What is claimed is:

1. A single mode tunable laser with a laser linewidth, wherein a laser cavity of the single mode tunable laser includes a laser gain medium, a first cavity mirror and a second cavity mirror and wherein the laser linewidth is narrowed by injecting an optical feedback into the first and second cavity mirrors simultaneously.

2. The single mode tunable laser of claim 1, wherein the single mode tunable laser comprises a U-laser with a side mode suppression ratio (SMSR) of at least 15 dB.

3. The single mode tunable laser of claim 1, wherein the narrowing of the laser linewidth is facilitated by removing an optical isolator from an assembly of the tunable laser and using one or more reflection elements, thereby allowing the optical feedback into the first and second cavity mirrors simultaneously.

4. The single mode tunable laser of claim 1, further comprising:
a beam splitter/combiner with a variable split/combining ratio and
wherein the one or more reflection elements are disposed after the beam splitter/combiner providing the optical feedback into the laser cavity.

5. The single mode tunable laser of claim 1, wherein the laser cavity is configured to include one or more cavity emission ports or power taps inside the laser cavity such that the optical feedback is injected into the first and/or second cavity mirrors via the one or more cavity emission ports.

6. The single mode tunable laser of claim 5, wherein the laser cavity comprises a circulating cavity including the one or more cavity emission ports.

7. The single mode tunable laser of claim 1, wherein the single mode tunable laser comprises a semiconductor laser, a solid-state laser, a gas laser, or a chemical laser.

8. The single mode tunable laser of claim 1, wherein a reflectivity of the first cavity mirror and a reflectivity of the second cavity mirror can be of any reflection percentage.

9. The single mode tunable laser of claim 1, wherein the laser linewidth is narrowed by injection of the optical feedback into the first cavity mirror and the second cavity mirror simultaneously by a predetermined amount, and wherein the predetermined amount comprises a fraction of a total output power of the single mode tunable laser.

10. The single mode tunable laser of claim 9, further comprising at least one reflection element at a predetermined distance, wherein the at least one reflection element is configured to generate the optical feedback into the laser cavity.

11. The single mode tunable laser of claim 10, wherein the at least one reflection element comprises a reflective surface, a feedback loop, a fiber grating, or a waveguide grating.

12. The single mode tunable laser of claim 1, wherein the single mode tunable laser comprises a distributed feedback (DFB) laser, an external cavity laser, a monolithically integrated laser, a hybrid integrated laser, or a heterogeneously integrated laser.

13. The single mode tunable laser of claim 1, wherein the single mode tunable laser includes at least one optical amplifier configured to amplify laser emission light and reflected feedback light at a location between the laser cavity mirrors and at least one reflection element.

14. A method for reducing a laser linewidth of a single mode laser including a laser cavity, wherein the laser cavity comprises: a laser gain, a first cavity mirror, and a second cavity mirror, the method comprising:
injecting an optical feedback simultaneously into the first cavity mirror and the second cavity mirror of the single mode laser.

15. The method of claim 14, wherein the single mode laser has a side mode suppression ratio (SMSR) of at least 15 dB.

16. The method of claim 14, wherein the laser cavity of the single mode laser is configured to have one or more additional cavity emission ports or power taps disposed inside the laser cavity.

17. The method of claim 16, wherein the optical feedback is injected into one or both of the cavity mirrors via the one or more additional cavity emission ports.

18. The method of claim 14, wherein the laser cavity comprises a circular cavity with one or more cavity emission ports.

19. The method of claim 14, wherein the single mode laser is a semiconductor laser, a solid state laser, a gas laser, or a chemical laser.

20. The method of claim 14, wherein the injection of optical feedback comprises:
injecting the optical feedback into the first cavity mirror and the second cavity mirror simultaneously by a predetermined amount that is a fraction of a total output power of the single mode laser.

21. The method of claim 14, wherein the optical feedback is generated by a reflection element disposed at a predetermined distance.

22. The method of claim 21, wherein the reflection element comprises at least a reflective surface, a feedback loop, a fiber grating or a waveguide grating.

23. The method of claim 14, wherein the single mode laser comprises a semiconductor laser based on InP, GaAs, GaN, Si or another semiconductor material.

24. The method of claim 14, wherein the single mode laser comprises an external cavity laser, a monolithically integrated laser, a hybrid integrated laser, or a heterogeneously integrated laser.

25. The method of claim 14, wherein the single mode laser comprises a fixed wavelength laser or a wavelength tunable laser.

* * * * *